(12) United States Patent
Kronmiller et al.

(10) Patent No.: US 6,996,793 B1
(45) Date of Patent: Feb. 7, 2006

(54) METHODS AND APPARATUS FOR STORING AND MANIPULATING DIAGONAL INTERCONNECT LINES OF A MULTIDIMENSIONAL INTEGRATED CIRCUIT DESIGN

(75) Inventors: Tom Kronmiller, Chapel Hill, NC (US); Steven Teig, Menlo Park, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 136 days.

(21) Appl. No.: 10/066,387

(22) Filed: Jan. 31, 2002

Related U.S. Application Data

(63) Continuation-in-part of application No. 09/526,266, filed on Mar. 15, 2000, now Pat. No. 6,625,611.

(60) Provisional application No. 60/298,135, filed on Jun. 12, 2001.

(51) Int. Cl.
  *G06F 17/50* (2006.01)
(52) U.S. Cl. ............ 716/9; 716/1; 716/12; 716/14; 716/15; 716/19; 716/7
(58) Field of Classification Search ............ 716/1, 716/7, 9, 12, 14, 15, 19
See application file for complete search history.

(56) References Cited

U.S. PATENT DOCUMENTS

| | | |
|---|---|---|
| 5,319,743 A | 6/1994 | Dutta et al. |
| 5,598,559 A | 1/1997 | Chaudhuri |
| 5,659,725 A | 8/1997 | Levy et al. |
| 5,781,906 A | 7/1998 | Aggarwal et al. |
| 5,845,270 A | 12/1998 | Schatz et al. |
| 5,857,180 A | 1/1999 | Halmark et al. |
| 5,937,408 A | 8/1999 | Shoup et al. |
| 6,073,134 A | 6/2000 | Shoup et al. |
| 6,085,147 A | 7/2000 | Mayers |
| 6,108,657 A | 8/2000 | Shoup et al. |
| 6,226,647 B1 | 5/2001 | Venkatasubramanian et al. |

(Continued)

OTHER PUBLICATIONS

Fontayne & Bowman, "The multiple Storage Radix Hash Tree: An Improved Region Query Data Structure", Digest of Technical Papers, ICCAD-87, pp. 305-305, undated; place of publication unknown.

(Continued)

*Primary Examiner*—Thuan Do
(74) *Attorney, Agent, or Firm*—Stattler, Johansen, & Adeli LLP

(57) ABSTRACT

Geometric objects, such as polygons, are defined in a multi-dimensional data space, and are represented by data segments. "N" dimensional hierarchical trees, or "ng" trees, are generated to organize the data segments into "outside child nodes" and "inside child nodes" in accordance with a discriminator value. One of "n" sides of a polygon is selected as the discriminator value. To create the ng tree, data segments are designated as "outside child nodes" if a data segment is outside the plane defined by the discriminator value, and data segments are selected as "inside child nodes" if the data segment is inside the plane defined by the discriminator value. This process of partitioning data segments into inside child nodes and outside child nodes is repeated recursively through each level of the ng tree. Techniques to represent diagonal interconnect lines of regions defined in a multidimensional design layout of an integrated circuit are disclosed. Techniques to extract capacitances exerted on diagonal interconnect lines in an integrated circuit ("IC") design are also disclosed.

24 Claims, 22 Drawing Sheets

U.S. PATENT DOCUMENTS

| | | |
|---|---|---|
| 6,263,339 B1 | 7/2001 | Hirsch |
| 6,292,810 B1 | 9/2001 | Richards |
| 6,317,750 B1 | 11/2001 | Tortolani et al. |
| 6,567,814 B1 | 5/2003 | Bankier et al. |
| 6,591,235 B1 | 7/2003 | Chen et al. |
| 6,625,611 B1 | 9/2003 | Teig et al. |
| 6,651,233 B2 * | 11/2003 | Teig et al. ............... 716/7 |

OTHER PUBLICATIONS

Fontayne & Brown, "The multiple Storage Radix Hash Tree; An improved Region Query Data Structure", Digest of Technical Papers, ICCAD-87, pp. 305-305, undated; place of publication unknown.

* cited by examiner

METHODS AND APPARATUS FOR STORING AND MANIPULATING DIAGONAL INTERCONNECT LINES OF A MULTIDIMENSIONAL INTEGRATED CIRCUIT DESIGN

CROSS REFERENCE TO RELATED APPLICATIONS

This application claims the benefit of U.S. Provisional Patent Application No. 60/298,135, filed Jun. 12, 2001, entitled "Methods And Apparatus For Representing And Manipulating Polygons In A Multidimensional Space." This application is also a continuation-in-part of U.S. patent application entitled "Method and Apparatus for Representing Multidimensional Data" filed on Mar. 15, 2000, now U.S. Pat. No. 6,625,611, and having the Ser. No. 09/526,266.

BACKGROUND OF THE INVENTION

1. Field of the Invention:

The present invention is directed toward the field of computers and electronic design automation, and more particularly towards storing representations of polygons for computer and electronic design automation applications.

2. Art Background:

Many applications today analyze multidimensional data records. A multidimensional data record contains a number of data values, which are defined along a number of dimensions (also called attributes or keys) in a multidimensional space. Such records are typically stored in data files or databases.

A spatial data record is one type of multidimensional data record. Spatial data records typically describe the attributes (e.g., the position, size, shape, etc.) of geometric objects, such as points, lines, polygons, regions, surfaces, volumes, etc. Spatial records are used in many fields, including computer-aided design, computer graphics, data management systems, robotics, image processing, geographic information systems, pattern recognition, and computational geometry.

Effective data structures are needed to organize multidimensional and spatial data records efficiently, in order to optimize the time for querying these records. For instance, a sequential list of the multidimensional data records provides the simplest way of storing the records. However, the time needed for performing a query on such a list is intolerably high in most cases since each record in the list needs to be examined for each query. Numerous multidimensional data structures have been proposed for organizing multidimensional and spatial data records. Hanan Samet, *The Design and Analysis of Spatial Data Structures*, Addison-Wesley Publishing, 1990, includes a review of many of these data structures.

Multidimensional data structures include hierarchical data structures. Hierarchical structures are based on the principle of recursive decomposition of the data space (i.e., the object space or the image space). In other words, these data structures are created by recursively dividing the data space, and storing the data records according to their location in the divided space. Quadtrees and k-d trees are two types of hierarchical data structures.

Electronic design automation ("EDA") applications assist engineers in designing integrated circuits ("IC's"). Specifically, these applications provide sets of computer-based tools for creating, editing, and analyzing IC design layouts. These layouts are formed by geometric shapes that represent layers of different materials and devices on IC's. Spatial data records define the spatial attributes of many of these geometric shapes. For instance, spatial data records are used to define geometric shapes that represent conductive interconnect lines. Interconnect lines route signals on the IC's. These lines are sometimes referred to as wire segments or segs. EDA applications typically characterize interconnect lines as rectangles. The rectangles depict interconnect lines deposed on the IC in a vertical and/or horizontal directions, relative to the boundaries of the integrated circuit. As described fully below, the present invention characterizes interconnect lines as polygons. The polygons depict interconnect lines deposed on the IC in diagonal directions, relative to the boundaries of the integrated circuit. Thus, it is desireable to create mechanisms to manipulate and store polygons in a multi-dimensional space.

SUMMARY OF THE INVENTION

Data, relating to a plurality of geometric objects, is stored to represent interconnect lines in a multidimensional design layout of an integrated circuit. A plurality of regions in the multidimensional layout are defined. At least a portion of the geometric objects in the multidimensional design layout represent diagonal interconnect lines. A diagonal interconnect line defines a line deposed in a direction other than zero or ninety degrees relative to the integrated circuit boundaries. A plurality of hierarchical data structures for a number of the regions are created. Each hierarchical data structure corresponds to a particular region and stores the data of the geometric objects within its particular region.

In one embodiment, a segment data for each of the "n" sided geometric objects are generated. The segment data specifies "n" number of sides and includes "n" vertices for a corresponding geometric object. A hierarchical tree, with k levels of nodes, is generated to represent the "n" sided geometric objects. Each node is associated with one of the segment data by selecting a discriminating node as a parent node for a corresponding level, computing a discriminator dimension, selecting one of the "n" vertices based on the discriminator dimension for the discriminating node for use as a discriminator key for each of the k levels, and by portioning nodes, not yet assigned to the hierarchical tree, into outside_child nodes and inside_child nodes based on a comparison between the discriminator key and segment data for a node under analysis and recursively portioning nodes into the outside child nodes and the inside_child nodes for each of the k levels.

DETAILED DESCRIPTION

The disclosure of U.S. Provisional Patent Application No. 60/298,135, filed Jun. 12, 2001, entitled "Methods And Apparatus For Representing And Manipulating Polygons In A Multidimensional Space" is hereby expressly incorporated herein by reference.

Figure 1:
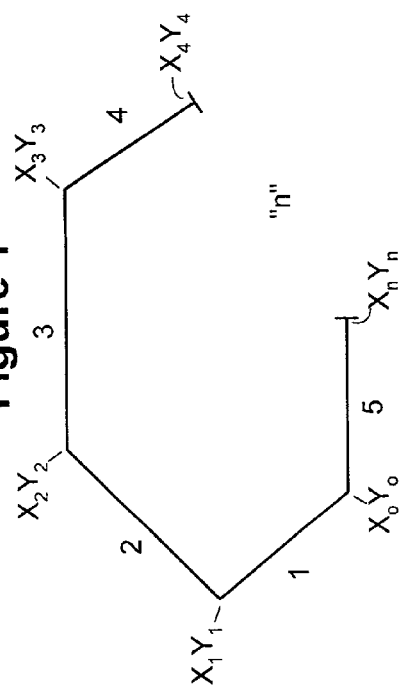
FIG. 1 illustrates an "n" sided polygon for use in the present invention.

A. Geometric Shapes of Segment Data:

The present invention uses geometric objects defined in a multi-dimensional data space. The geometric objects are represented by data tuples or data segments for processing in a computer. In one embodiment, the geometric objects comprise polygons. Different embodiments of the present invention use different classes of polygons. FIG. 1 illustrates an "n" sided arbitrary polygon as an example of a geometric object. For the example geometric object of FIG. 1, the "n" sided arbitrary polygon is represented by "n" vertices. Specifically, for this embodiment, the "n" sided polygon is defined by the the vertices $\{X_1Y_1, X_2Y_2, X_3Y_3, X_4Y_4$ and $X_nY_n)$, relative to a two-dimensional coordinate axes. In other embodiments, the geometric objects may be defined in a coordinate system with more than two dimensions (e.g., a three-dimensional coordinate system). Although the "n" sided polygon illustrated in FIG. 1 is shown with more than five sides (e.g., "n" is greater than or equal to "6"), a geometric object may be defined by two or more vertices (e.g., "n" is greater then or equal to two).

Figure 2A:
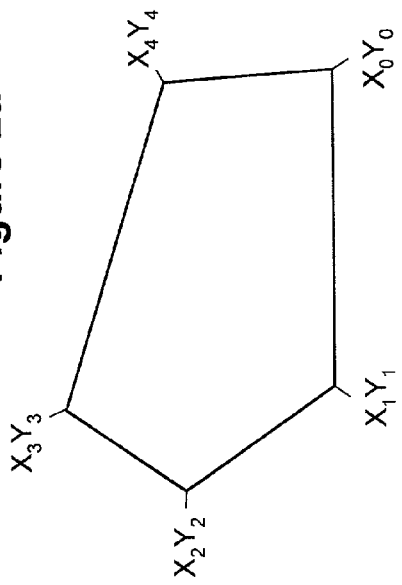
FIG. 2a illustrates an example of a convex polygon for use as a data segment.
Figure 2D:
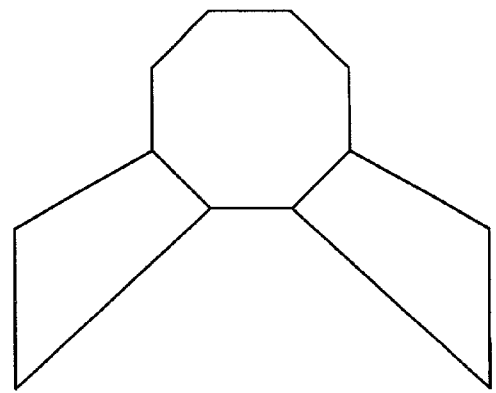
FIG. 2d illustrates an example of a wiring configuration that has two interconnect wires, represented by two oblique rectangles, joined by an octagon shaped connector.
Figure 2C:
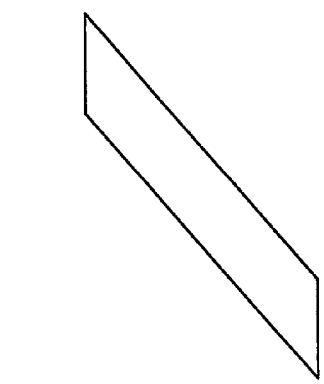
FIG. 2c illustrates an oblique rectangle with an orientation that does not align with the x-y coordinate axes.

As described more fully below, the geometric object may comprise rectangles. The rectangles may be aligned with the coordinate axes (i.e., 0 or 90 degrees relative to the xy coordinate axes) or the rectangles may be situated at angles other then 0 or 90 degrees (i.e., rectangles of arbitrary orientation in a multi-dimensional data space). The geometric objects may also include oblique rectangles with a predefined set of values that define the rectangle's orientation in a multi-dimensional space. In one embodiment, the rectangles are situated, relative to an x-y coordinate axes, in a multi-dimensional space at multiples of 30 and 45 degree angles (e.g., 30, 45, 60, 90, 120, 135, 150, and 180, etc). FIG. 2c illustrates an oblique rectangle with an orientation that is not parallel or perpendicular with the x-y coordinate axes.

An arbitrary polygon (FIG. 1) used in the present invention may comprise convex polygons. As used herein, a "convex polygon" is defined as a closed geometric object consisting of: (1) two (2) or more sides or edges; (2) the property that the interior of the polygon on the outside side of the edge, when facing forward from the edge's viewpoint, turns at least partially to the outside when the advancing around the polygon from one edge to the next edge (i.e., no collinear edge); and (3) no repetition in vertices, $X_1Y_1$ (i.e., the polygon does not have duplicate vertices). FIG. 2a illustrates an example of a convex polygon for use as a data segment. For the example convex polygon shown in FIG. 2a, the geometric object is defined by its vertices ($X_0Y_0$, $X_1Y_1, X_2Y_2, X_3, Y_3, X_4, Y_4$).

Figure 2B:
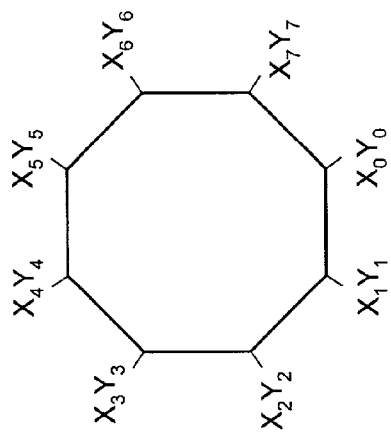
FIG. 2b illustrates an example octagon geometric object.

Another example of a geometric object that may be used in the present invention is an octagon. FIG. 2b illustrates an example octagon. The octagon, which consists of eight sides, is represented, in a data segment, by 8 vertices ($X_0Y_0$, $X_1Y_1 \ldots X_nY_n$).

As described more fully below, the geometric objects have application for defining wires in an integrated circuit design. In one embodiment, the wires are deposed at diagonal angles relative to the boundaries of the integrated circuit. As used herein, diagonal wiring geometries consist of interconnect wires of an integrated circuit or integrated circuit design situated at angles other than 0 or 90 degrees (ie., parallel or perpendicular) to the boundaries of the integrated circuit. However, diagonal wiring geometries may also include wires situated parallel or perpendicular to the boundaries of the integrated circuit. (referred to as "Manhattan directional wiring"). U.S. patent application Ser. No. 09/733, 104, entitled "Multi-Directional Wiring On A Single Metal Layer", filed on Dec. 7, 2000, discloses embodiments for diagonal wiring geometries in integrated circuits, and is expressly incorporated herein by reference. For embodiments employing diagonal wiring geometries, the octagon may be used to represent a connector between two or more wires situated at angles other than 0 or 90 degrees. FIG. 2d illustrates an example of a wiring configuration that has two interconnect wires, represented by two oblique rectangles, joined by an octagon shaped connector.

Figure 3:
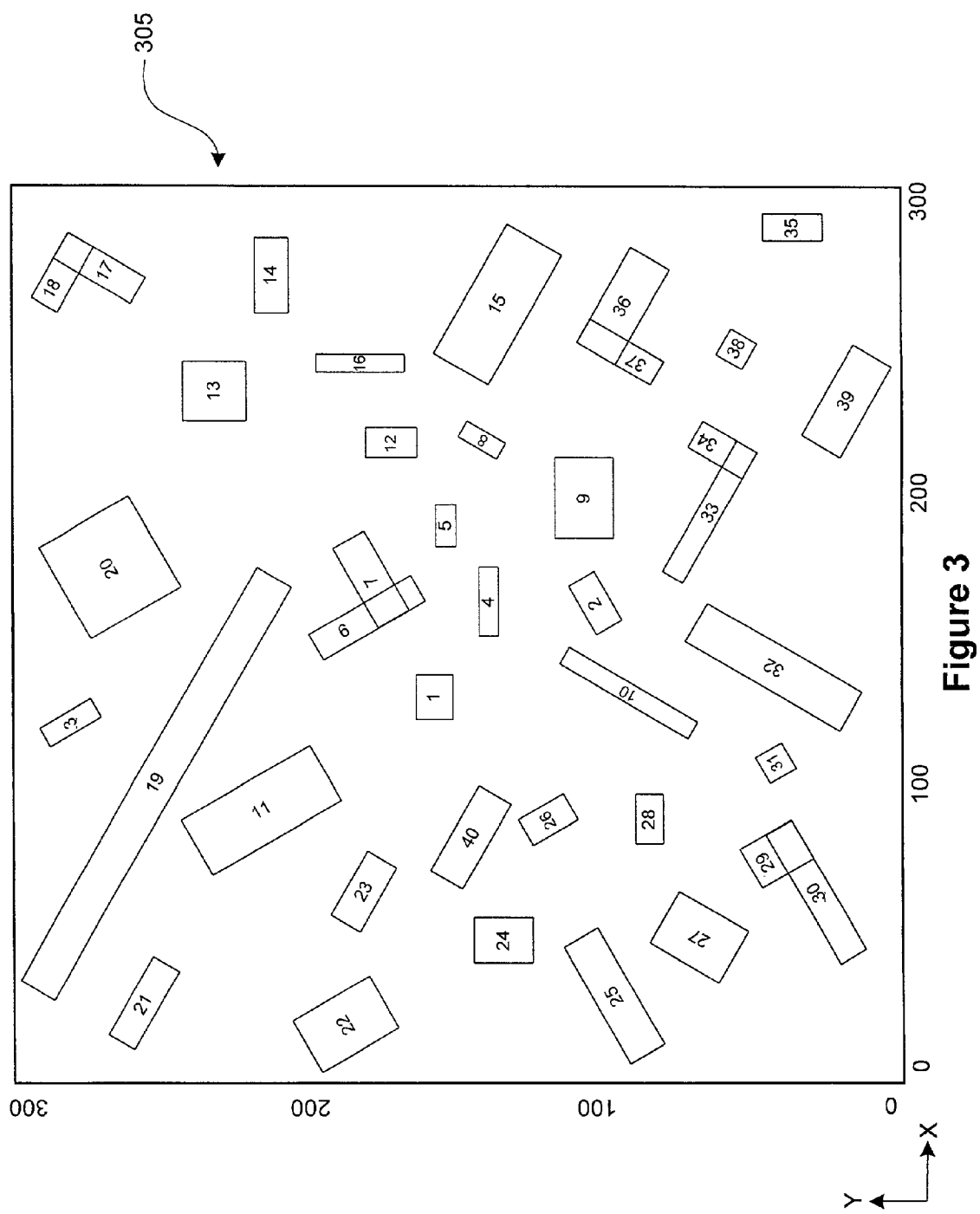
FIG. 3 illustrates an example wiring layer of an integrated circuit design that employs diagonal wiring.

FIG. 3 illustrates an example interconnect layer of an integrated circuit design that employs diagonal wiring. As shown in FIG. 3, the rectangles, which depict interconnect wires on an IC design, are situated at various angles relative to the boundaries of the integrated circuit. For example, interconnect wire 10 is deposed at an angle of 45 degrees, and interconnect wire 19 is deposed at an angle of 135 degrees. In one embodiment for employing diagonal wiring geometries, the wires are deposed at 30 and 45 degree angles, as well as other angles that are multiples of 30 and 45 degree angles.

Figure 4A:
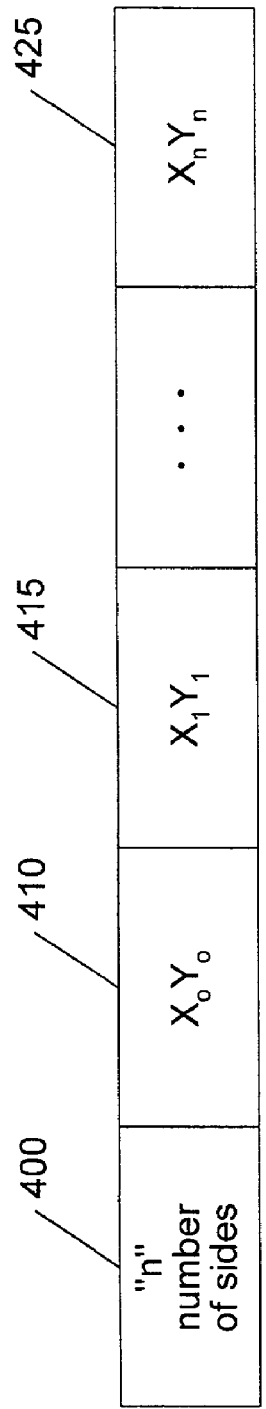
FIG. 4a illustrates one embodiment for a data segment that defines a geometric object.

FIG. 4a illustrates one embodiment for a data segment that defines a geometric object. For this embodiment, the data segment defines, in field 400, the number of sides in the geometric object. For the example arbitrary polygon shown in FIG. 1, this field stores the integer "n", to depict that the polygon has "n" sides. The data segment of FIG. 4a also stores vertices for the geometric object. Specifically, for this example, a first vertex, $X_0Y_0$, is stored in field 410, a second vertex, $X_1Y_1$, is stored in field 415, and an "nth" vertex is stored in field 425. Although the data segment of FIG. 4a is the shown as having distinct fields for the number of sides and for each vertex, a data structure arranged in a different manner may be used without deviating from the spirit or scope of the invention.

Figure 4B:
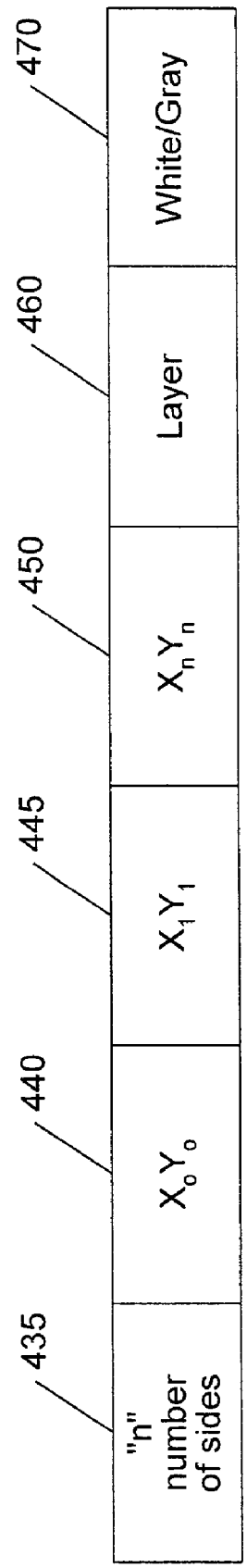
FIG. 4b illustrates one embodiment for a data segment that defines a geometric object for an interconnect wire.

FIG. 4b illustrates one embodiment for a data segment that defines a geometric object for an interconnect wire. Similar to the data segment of FIG. 4a, the data segment of FIG. 4b includes a field 435 that defines the number of sides in the geometric object, as well as "n" fields (440, 445, and 450) that define "n" vertices for the geometric object. In addition to defining the number of sides and vertices in a multi-dimensional space, the data segment of FIG. 4b also defines a layer and a white/gray designation, in fields 460 and 470, respectively. The layer field 460 specifies a metal wiring layer in an integrated circuit design for the interconnect wire, and the white/gray designation defines whether the segment is critical.

B. Ng Tree Using Diagonal Lines as Discriminators:

One embodiment of the invention generates "n" dimensional hierarchical trees (referred to herein as n-gon trees or simply "ng" trees). The ng trees are a form of a binary tree that organizes data tuples or data segments into "outside child nodes" and "inside child nodes" in accordance with a discriminator value. The discriminator value is selected for each layer or discriminator dimension in the ng tree. In one embodiment for the ng tree, one of "n" sides of a polygon is selected as the discriminator value. To create the ng tree, data segments are designated as "outside child nodes" if a data segment is outside the plane defined by the discriminator value, and data segments are selected as "inside child nodes" if the data segment is inside the plane defined by the discriminator value. This process of partitioning data segments into inside child nodes and outside child nodes is repeated recursively through each level of the ng tree.

Figure 5:
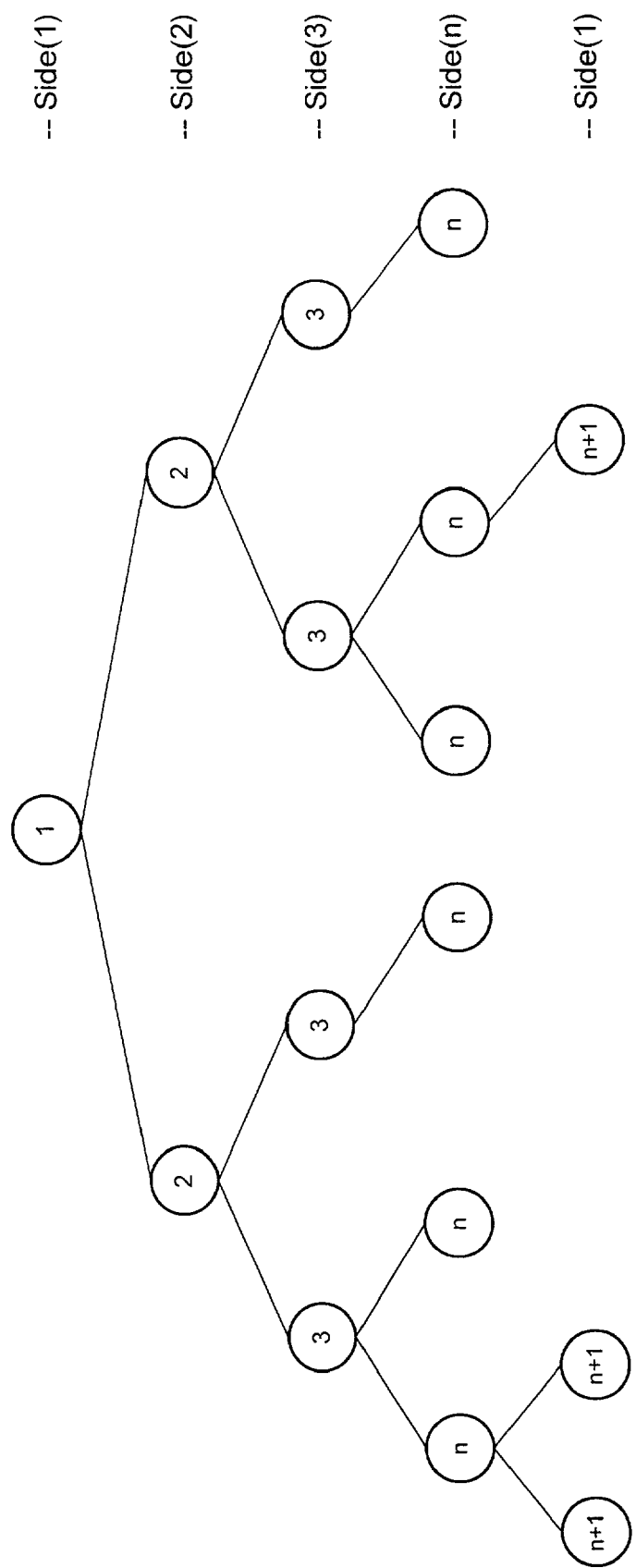
FIG. 5 illustrates an example of an ng tree.

FIG. 5 illustrates an example of an ng tree. The ng tree may be represented in a hierarchical data structure with one or more "nodes" at each level of the tree. The nodes in the ng tree of FIG. 5 are labeled based on the node's level in the tree. For this example, there are "n+1" levels in the ng tree. As described more fully below, the number of levels in the tree is dependent upon the number of data segment elements arranged in the ng tree. As described more fully below, the discriminator value for each level is determined dynamically (i.e., discriminator value=current_depth of ng tree modulo (sides of polygon in discriminating node). Thus, the ng tree cycles through the "n" sides of a discriminating node to partition nodes into outside child nodes and inside child nodes.

Figure 6:
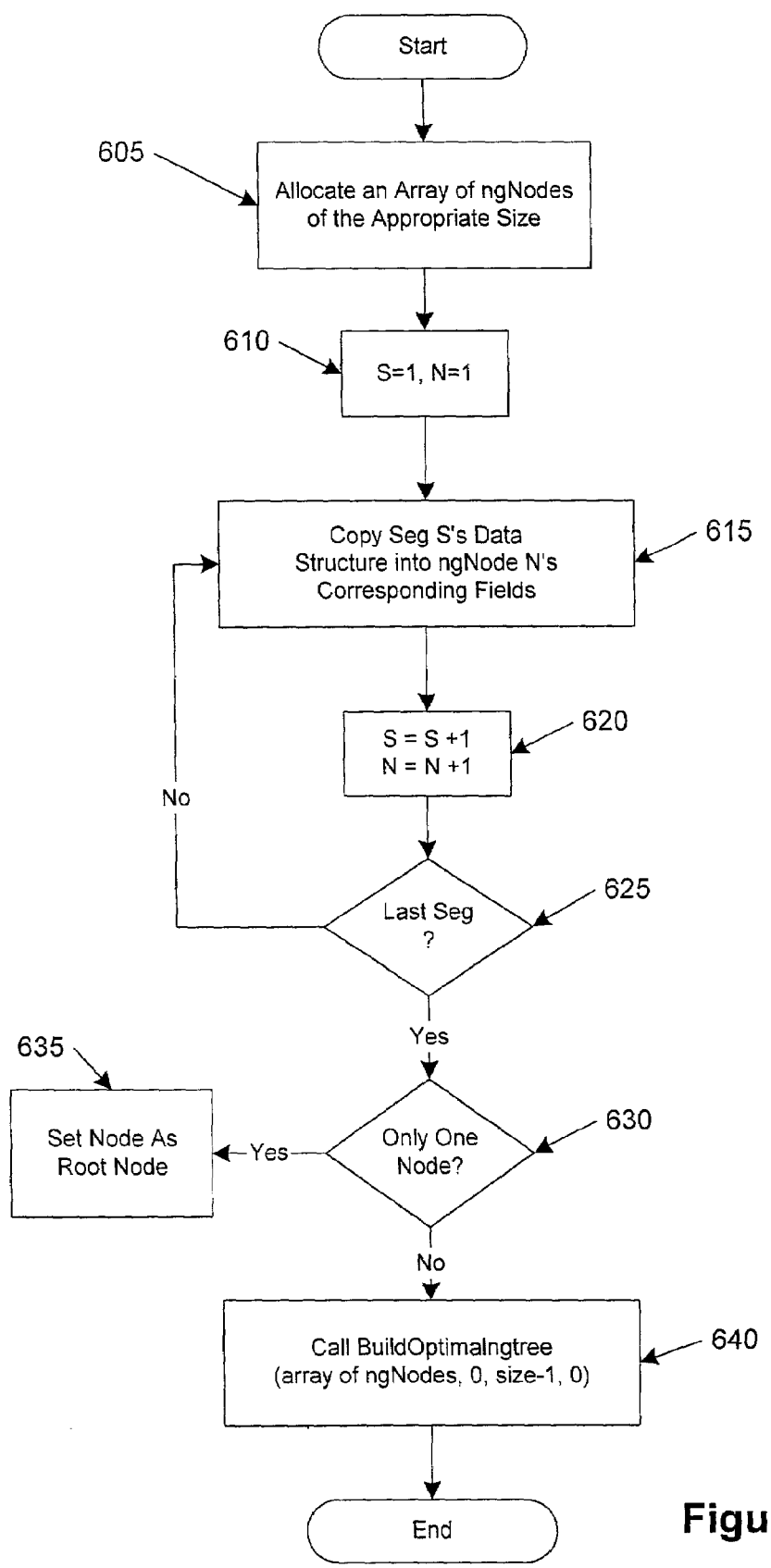
FIG. 6 is a flow diagram illustrating one embodiment for populating an array of ngNodes for generation of an ng tree.

FIG. 6 is a flow diagram illustrating one embodiment for populating an array of ngNodes for generation of an ng tree. First, an array of ngNodes of the appropriate size is allocated to store data segments of the ng tree (block 605, FIG. 6). Pointers used in the process to generate the ng tree are initialized (S=1, N=1) (block 610, FIG. 6). Specifically, "S" is a pointer to a data segment, and "N" is a pointer to a node in the array of ngNodes. The process copies data from data segment "S" data structure into ngNode N's corresponding fields (block 615, FIG. 6). The pointers to the data segments "S" and the array of ngNodes "N" are incremented (block 620, FIG. 6). If the last data segment has not been copied into the array of ngNodes, then the process repeats steps 615 and 620 (block 625, FIG. 6). If the last data segment has been copied into the array of ngNodes, then the process determines whether there is only one node (block 630, FIG. 6). If there is only one node in the array of ngNodes, then this node is set as the root node for the ng tree (block 635, FIG. 6). Alternatively, if they are more than one node, then the process calls a "BuildOptimalNgTree" process, with the array of ngNodes as an input parameter (block 640, FIG. 6). Although the present invention is described using multiple processes for creating the ng tree and its associated hierarchical data structure, one or more software routines or processes may be implemented to perform these functions without deviating from the spirit or scope of the invention.

Figure 7:
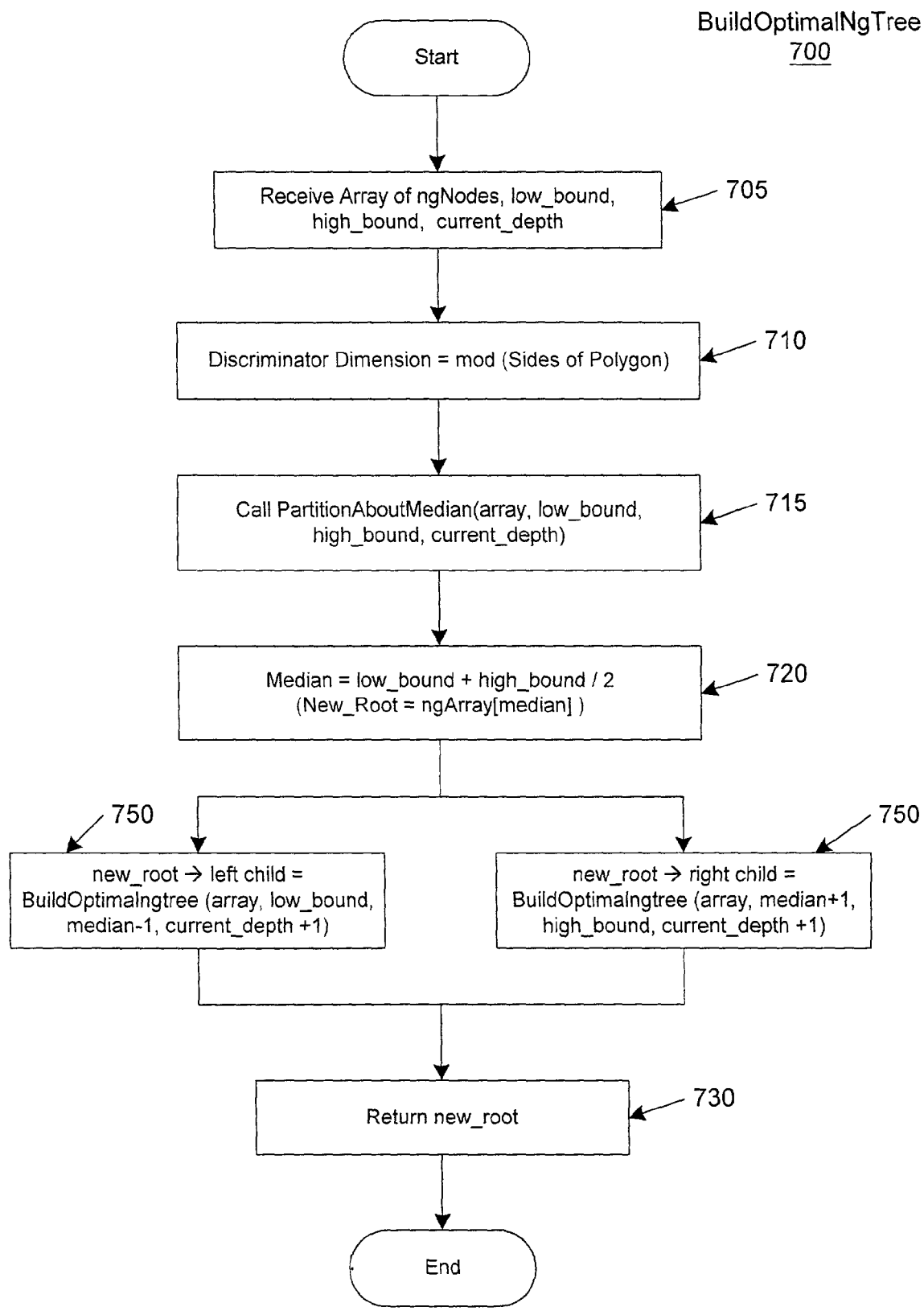
FIG. 7 is a flow diagram illustrating one embodiment for the BuildOptimalNgTree process.

FIG. 7 is a flow diagram illustrating one embodiment for the BuildOptimalNgTree process. The BuildOptimalNgTree process 700 receives, as input parameters, an array of ngNodes, a low_bound node, a high_bound node, and a current_depth (block 705, FIG. 7). The low_bound parameter specifies a node with the lowest value relative to a discriminator dimension. Similarly, the high_bound parameter specifies a node with the highest value relative to a discriminator dimension. The BuildOptimalNgTree routine 700 is called recursively. The current_depth parameter specifies the level of the tree for the corresponding call to the BuildOptimalNgTree routine.

In one embodiment, the low_bound and high_bound parameters, which comprise 64-bit values, store the minimum and maximum penetration "distances" of any segments within the discriminator half planes. The distance involves the computation:

$$F1(coords)/sqrt(F2(coords)),$$

where the F2(coords) is a constant for a given half plane. In one embodiment, the process stores F1(coords) to eliminate the floating point, division, and sqrt computations.

The process sets the discriminator dimension for the current_depth (block 710, FIG. 7). In one embodiment, the process sets the discriminator dimension equal to the value of the current_depth multiplied by the modulo (number of sides of the polygon). A process, referred to herein as the "PartitionAboutMedian" is called to partition the nodes around a median (block 715, FIG. 7). This process is shown in the flow diagram of FIG. 8. The PartitionAboutMedian process includes, as input parameters, an array, a low_bound node, a high_bound node, and a current_depth. In one embodiment, the partition about median routine for the ng tree is as follows. A random element of the specified sub-array is chosen and is designated as the "median node." In one embodiment, the median for the array of ngNodes is set from the expression:

$$low\_bound + high\_bound/2.$$

The new_root of the array of ngNodes is identified by the median value (block 720, FIG. 7). Based on the current_depth, one of the edges of the polygon, represented by that node, is chosen. The PartitionAboutMedian routine then goes through the rest of the nodes in the sub array partitioning the outside nodes to the left of the median node and the inside nodes to the right of the median node. This procedure does not guarantee a balanced tree (i.e., same number of nodes to the outside and to the inside of the median node). The new_root for the outside child is determined by recursively calling the BuildOptimalNgTree routine, with the array, low_bound, median–1, and current_depth+1 as parameters (block 750, FIG. 7). Similarly, to determine a new_root for the inside child, the BuildOptimalNgTree routine is recursively called with array, median+1, high_bound, and current_depth+1 as input parameters (block 750, FIG. 7). The BuildOptimalNgTree routine 700 returns new_root (block 730, FIG. 7). Some embodiments of the invention use a partitioning algorithm that is disclosed in Robert Sedgewick, *Algorithms in C++, Third Edition, Parts* 1–4, Addison-Wesley Publishing, 1998, Chapter 7, and in Cormen, et al., *Introduction to Algorithms*, Section 8, 1996.

Figure 8:
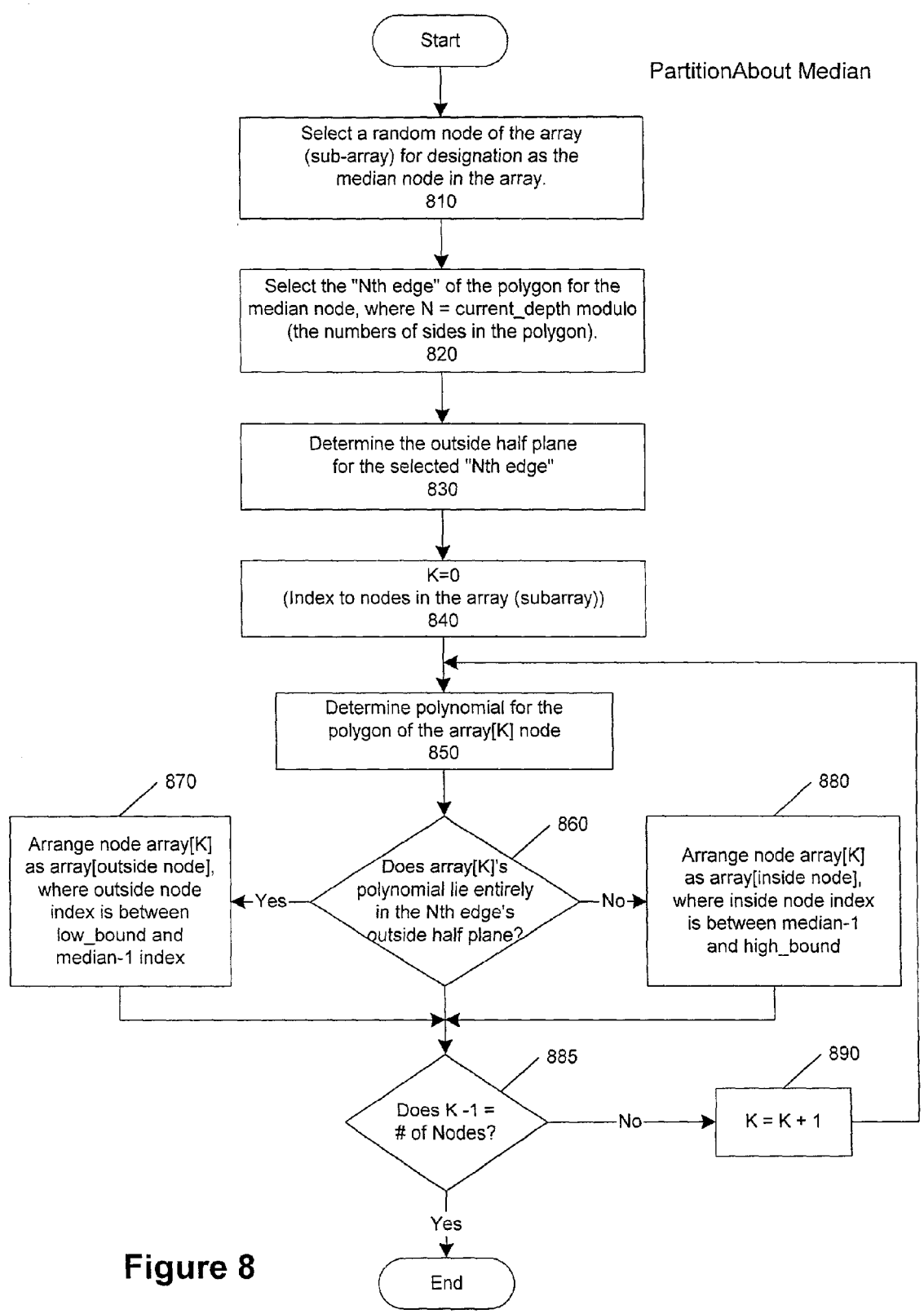
FIG. 8 is a flow diagram illustrating one embodiment for the PartitionAboutMedian routine.

FIG. 8 is a flow diagram illustrating one embodiment for the PartitionAboutMedian routine. For this embodiment, the PartitionAboutMedian routine selects a random node in the array, or sub array, of ngNodes for designation as the median node in the array/sub array (block 810, FIG. 8). The PartitionAboutMedian routine selects the "Nth" edge of the polygon for the median node, where N is computed from the current_depth modulo (the number of sides in the polygon) (block 820, FIG. 8). The PartitionAboutMedian routine determines the outside half plane for the selected "Nth" edge (block 830, FIG. 8).

In one embodiment for determining half planes, the Nth edge of the polygon (e.g., $8^{th}$ edge of an octagon) is designated a vector from point "N-1" to point "N" of the polygon. The first edge, edge #1, is defined from point 0 ("P0") to point 1 ("P1"), and the second edge, edge #2, is defined from point 1 (P1) to point 2 ("P2"), etc. At the last edge of the polygon, the segment wraps around so that the closing edge, N, runs from point N-1 to point 0. For example, in a 3-gon, the edges are defined by P0->P1, P1->P2, and P2->P0. A line defined by these segments splits the plane into two half planes. The half plane to the left of the line segment (looking forward from P0 to P1) is arbitrarily selected as the half plane defined by the segment. Therefore, the vector P1->P0 defines the other half plane. This embodiment for defining a half plane provides a counter-clockwise orientation to the edges of the polygon.

The equation in the form |F1(coords)|/sqrt(F2(coords)) yields the minimum distance between a point and the line that forms the border of the half plane. If the process eliminates the step of computing the absolute value, then the equation yields a negative distance for segments outside the half plane and a positive distance for segments inside the half plane. In one embodiment, if the defining line has a distance of 0 from the segment, then the segment is arbitrarily defined as inside. This permits a mathematical definition for the "inside" and "outside" of the half plane. For additional explanation on half planes, see "Pre-Calculus Mathematics", Shanks/Brumfiel/Fleenor/Eicholz, Addison-Wesley, 1965, and "Computational Geometry in C", O'Rourke, Cambridge University Press, 1993, reprinted in 1996 with corrections from 1994 reprint.

The process initializes an index, K, to nodes in the array/sub array (block 840, FIG. 8). A polynomial for the polygon of the array[K] node is determined (block 840, FIG. 8). The PartitionAboutMedian routine then determines whether the polynomial for array[K]'s node lies entirely in the Nth edge's outside half plane (block 860, FIG. 8). If it does, then the node array[K] is arranged as an outside node (i.e., array[outside node]), where outside node index is between low_bound and median-1 index (block 870, FIG. 8). Alternatively, if the polynomial for array[K]'s node does not lie entirely in the Nth edge's outside half plane, then the node array[K] is arranged as an inside node (i.e., array [inside node]), where inside node index is between median–1 and high_bound (block 880, FIG. 8). The PartitionAboutMedian routine then determines whether there are any nodes in the array/sub-array not yet assigned to a node of the ng tree. Specifically, the process determines whether (K–1) is equal to the number of nodes in the array of ngNodes (block 885, FIG. 8). If it is, then the PartitionAboutMedian routine ends. If (K–1) does not equal the number of nodes in the ngNode array, then the index into the ngNode array, K, is incremented (i.e., K=K+1) (block 890, FIG. 8).

C. A Multi-Dimensional Data Structure:

Some embodiments of the invention provide a method for organizing multidimensional data tuples or segment data. A data tuple is a set of dimension values (also referred to herein as "data values" or "segment data") that collectively represents one entity (e.g., a person, an item, a spatial object, etc.). The dimension values for each data tuple are specified along a number dimensions. These dimensions collectively define a multidimensional data space.

In some embodiments of the invention, each data tuple is formed as a data object (i.e., as an instantiation of a class in an object-oriented program). In other embodiments, however, the data tuples are not represented as data objects.

Figure 9:
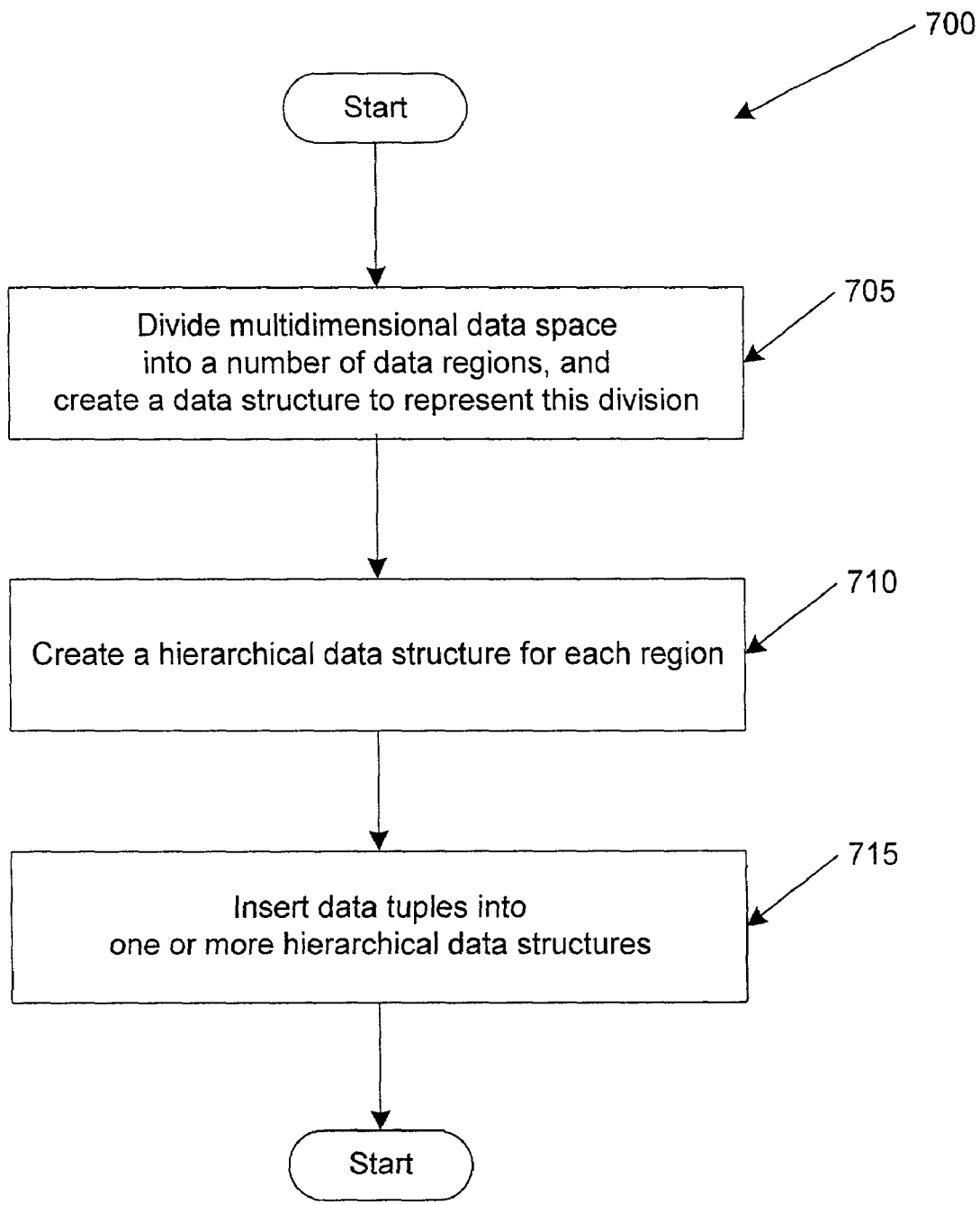
FIG. 9 illustrates a process 700 used by some of these embodiments.

Some embodiments of the invention create a two-layered data structure to organize the multidimensional data tuples. FIG. 9 illustrates a process 700 used by some of these embodiments. As shown in this figure, the process 700 initially divides (at 705) the multidimensional data space along one or more dimension values. This division results in a number of data regions. The process 700 creates a data structure (e.g., a non-hierarchical data structure) to represent this division. This data structure represents the first data structure layer.

For each data region, the process (at 710) then creates a hierarchical data structure that represents the second data structure layer. Next, the process (at 715) inserts each data tuple into one or more hierarchical data structures. In particular, the process inserts each data tuple into the hierarchical data structure for the data region that encompasses the data tuple.

Some data tuples cross more than one data region. For some embodiments of the invention, process 700 inserts data tuples into the hierarchical data structures of each data region that they cross. For instance, in some embodiments, the process 700 divides each data tuple that crosses a data region boundary into two tuples along the data region boundary that the data tuple crosses. One of the resulting two tuples falls within one data region, while the other resulting tuple falls within the other data region. The resulting data tuples are then inserted into the hierarchical data structures of their corresponding data regions.

For some embodiments of the invention, the process 700 also inserts a data tuple into more than one hierarchical data structure if that data tuple is needed for the analysis of data tuples in more than one hierarchical data structure. For instance, a data tuple might fall outside of a particular data region but might be necessary for the analysis of one or more data tuples within that data region. In the discussion below, the term "non-source" refers to this type of data tuples. Specifically, for a particular data region, a source data tuple is a data tuple that resides in the data region, while a non-source data tuple is a data tuple that is outside of the data region but it is necessary for the analysis of one or more data tuples within the data region.

In some embodiments of the invention, the process 700 inserts a copy of some or all of each non-source data tuple for a particular region into that region's hierarchical data structure. This ensures that only one hierarchical data structure is queried for the data tuples of a particular data region. In other embodiments, the non-source data tuples for a particular data region is analyzed with the data structures of the data regions that surround the particular data region. Hence, for the data tuples in a particular data region, these embodiments not only query the data structure for that data region but also query the data structures of the surrounding data regions.

D. Data Structure for Organizing Interconnect Line Data:

A wide range of applications are applicable to the invention to create efficient multidimensional data structures. For instance, EDA applications may use the invention's data structures to efficiently organize data relating to interconnect lines on IC's, including interconnect lines deposed in directions other than horizontal or vertical (e.g., diagonal interconnect lines). Such an organization speeds up the identification of nearby interconnect lines and hence speeds up the capacitance extraction process.

Figure 10:
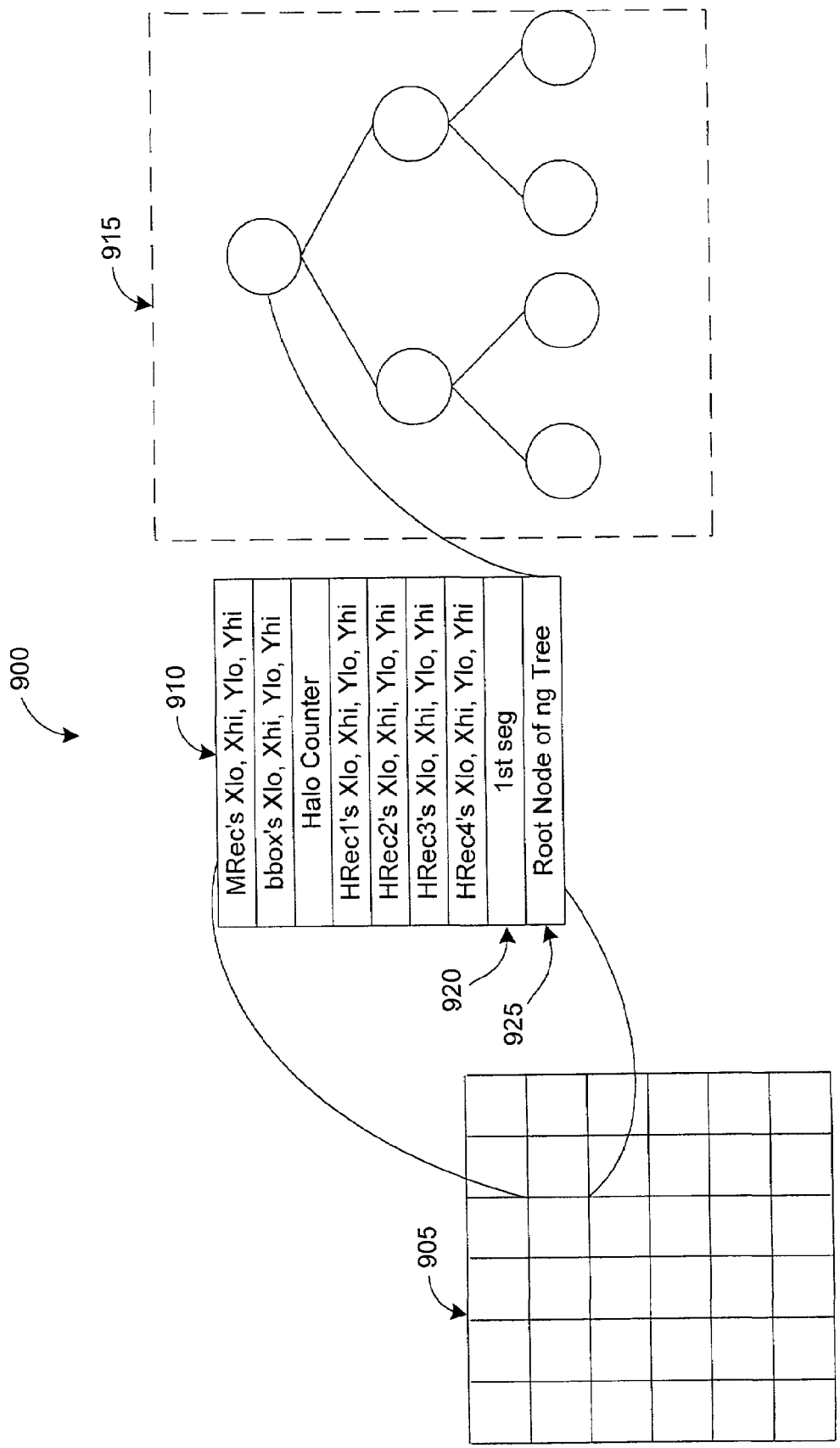
FIG. 10 illustrates one embodiment of the invention to store data relating to interconnect lines on an integrated circuit.

FIG. 10 illustrates one embodiment of the invention to store data relating to interconnect lines on an integrated circuit. As shown in FIG. 10, this embodiment is a two-layer data structure 900. The first layer is a two-dimensional array 905 of tile data structures 910, and the second layer is an ng tree 915 associated with each tile data structure.

Each tile data structure 910 represents a tile region on the IC layout. As further described below, some embodiments of the invention use rectangular tiles 1205 that divide the IC layout along x- and y-axes. Dividing the IC layout into tiles along the x- and y-axes divides the IC design space into rectangular buckets that are defined (1) along the x- and y-axes, by their tiles, and (2) along the z-axes by the thickness of the IC. One of ordinary skill in the art will understand that other embodiments of the invention divide the IC layout space into different shaped regions and along different sets of axes.

As shown in FIG. 10, each tile data structure 910 has an associated ng tree 915. Each tile's ng tree efficiently organizes the data relating to the source and non-source interconnect lines for that tile. For a particular tile, a source interconnect line is a line that resides in the tile, while a non-source line is a line that lies outside of the tile, but the line is necessary for the analysis of one or more lines within the tile. The tile data structure 910 will be discussed more fully below.

Figure 11:
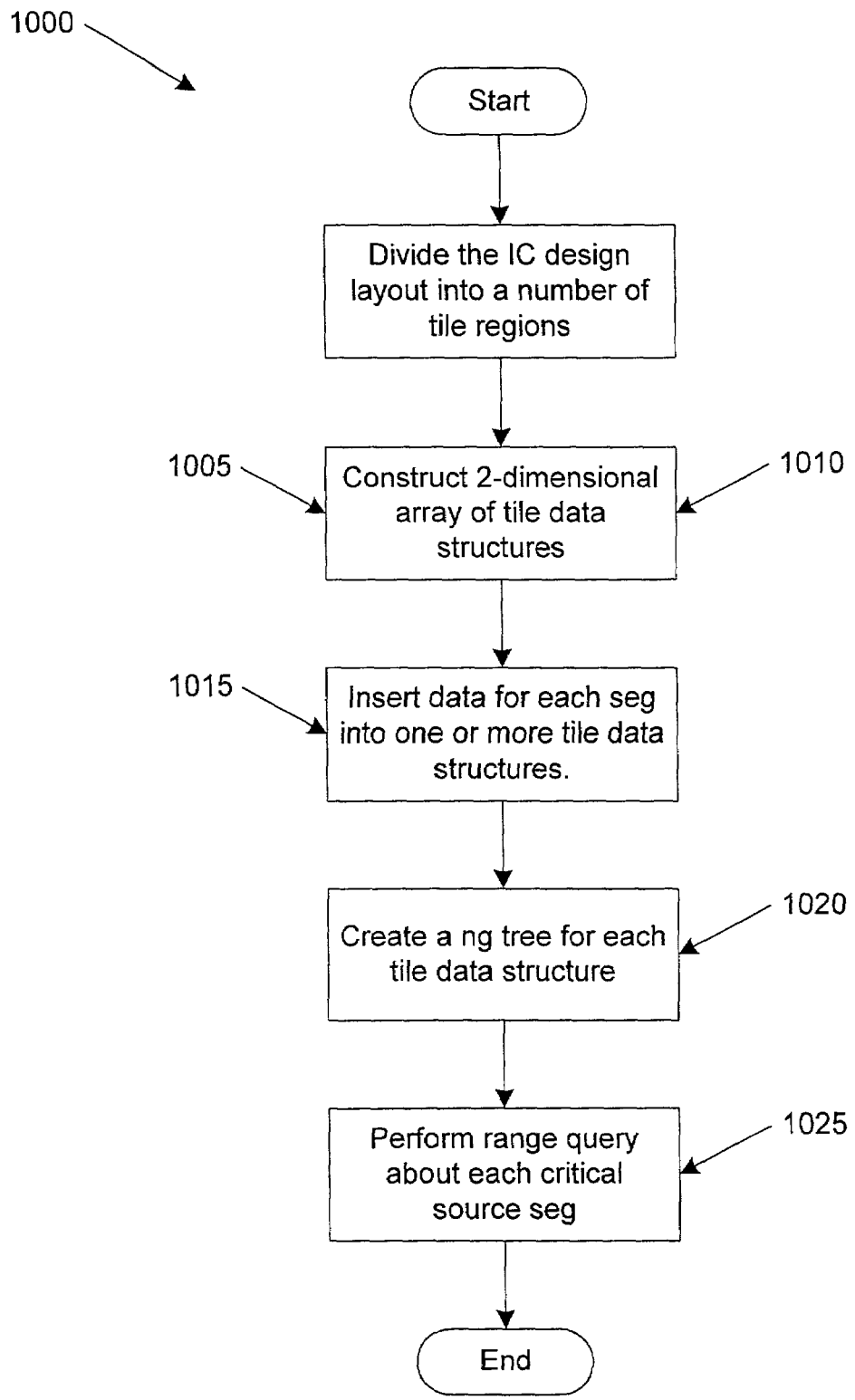
FIG. 11 illustrates a process 1000 that some embodiments of the invention use (1) to create the two-layer data structure of FIG. 10, and (2) to query the data in this structure.

FIG. 11 illustrates a process 1000 that some embodiments of the invention use (1) to create the two-layer data structure 900 of FIG. 10, and (2) to query the data in this structure. As shown in FIG. 11, the process divides (at 1005) the IC layout into a number of tile regions along the x- and y-axes. The process then constructs (at 1010) a two-dimensional array of tile data structures, where each tile data structure represents a tile region. Next, the process inserts (at 1015) the data for each interconnect segment into one or more of the tile data structures. For each tile region, the process creates (at 1020) an ng tree that stores the interconnect-line data that was inserted into that region's tile data structure. Finally, the process performs (at 1025) a range query about each critical source segment that was entered into the ng trees. Each of these steps is further discussed below.

Figure 12:
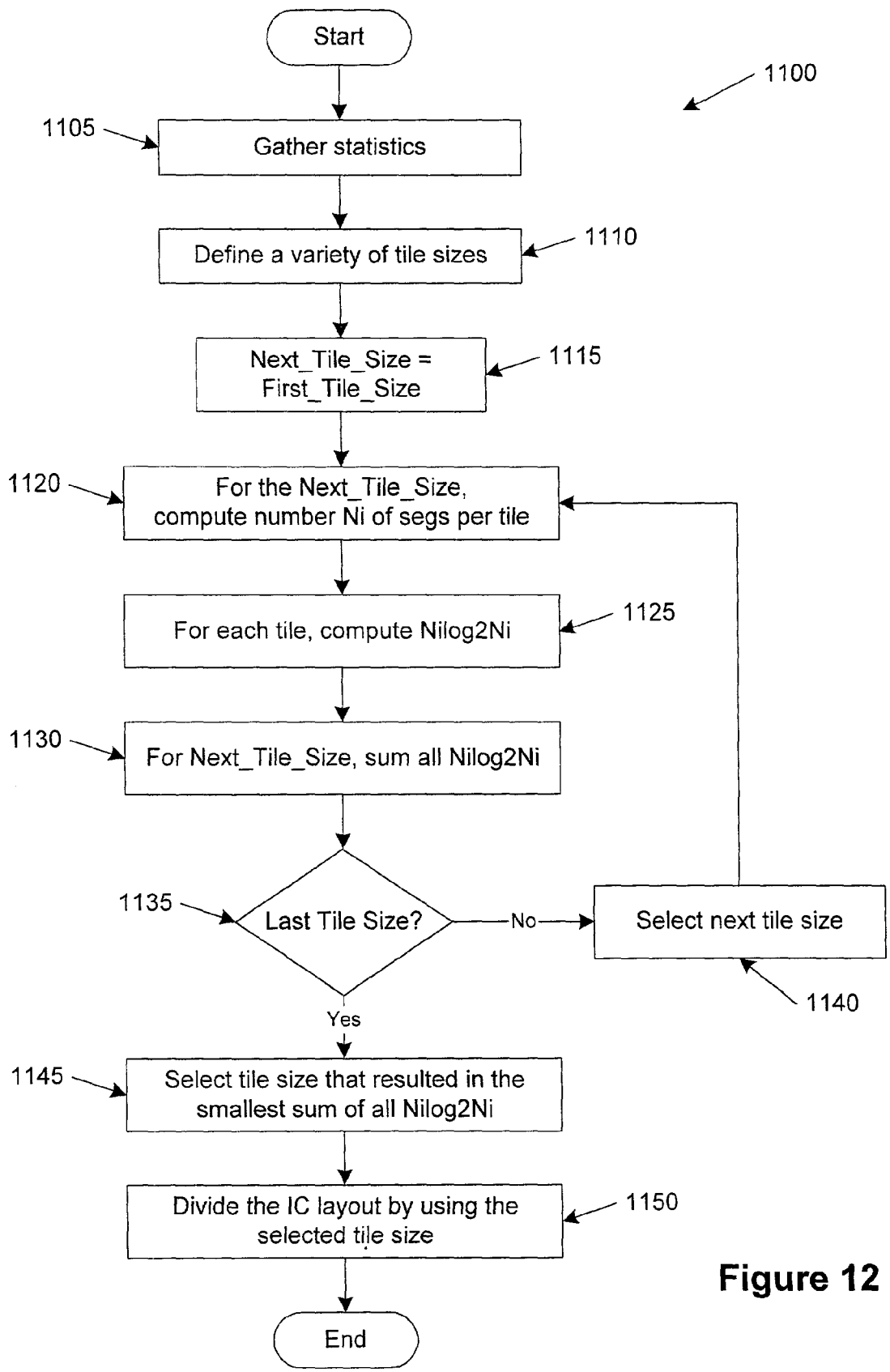
FIG. 12 presents a process for dividing an IC-data space into a number of tiles along the x- and y-axes.

E. Determining the Tile Regions:

FIG. 12 presents a process 1100 for dividing an IC-data space into a number of tiles along the x and y-axes. Initially, the process gathers (at 1105) statistics about the IC layout. Some embodiments of the invention gather statistics by examining all interconnect lines in the IC's design space. In some embodiments, the statistics that are gathered include the number of interconnect segments, the dimensions of the segments, and the width and height of the chip.

Some embodiments also determine (at 1105) the maximum halo size. The halo size is the maximum distance of capacitive influence between two segments. In some embodiments, the halo size is adaptively calculated by using known prior art techniques. The halo distance may be different for each layer of the IC. Some embodiments set the halo size to the maximum halo value across all layers.

After gathering statistics, the process then specifies (at 1110) a variety of tile sizes. To do this, some embodiments specify a variety of rows and columns for dividing the IC layout. A given tile size might require the number of rows to differ from the number of columns. This tile size is beneficial in situations where the distribution of segments in the horizontal direction is significantly different from the distribution in the vertical direction.

Next, the process selects (at 1115) the first specified tile size for analysis. For this tile size, the process computes (at 1120) the number of segments $N_1$ per tile. As further described below, some embodiments do not actually compute the number of segments $N_i$ per tile but rather statistically determine this number.

The process then computes (at 1125) the time for querying all the records in the ng tree for that tile (i.e., compute $N_1 \log_2 N_i$ for that bin). Next, the process sums (at 1130) the search times for all the tiles to obtain the total search time. Equation (4) mathematically explains the total search time.

$$\text{Total Search time} \propto \sum_{\text{Tiles}} N_1 \log 2 N_1 \quad (4)$$

The process (at 1135) then determines whether it has examined the last tile size. If not, the process (at 1140) selects the next tile size and then repeats the process to compute the total search time for the next tile size. Otherwise, the process (at 1145) identifies the smallest calculated total search time, and selects the tile size that resulted in this search time.

Figures 13, 14:
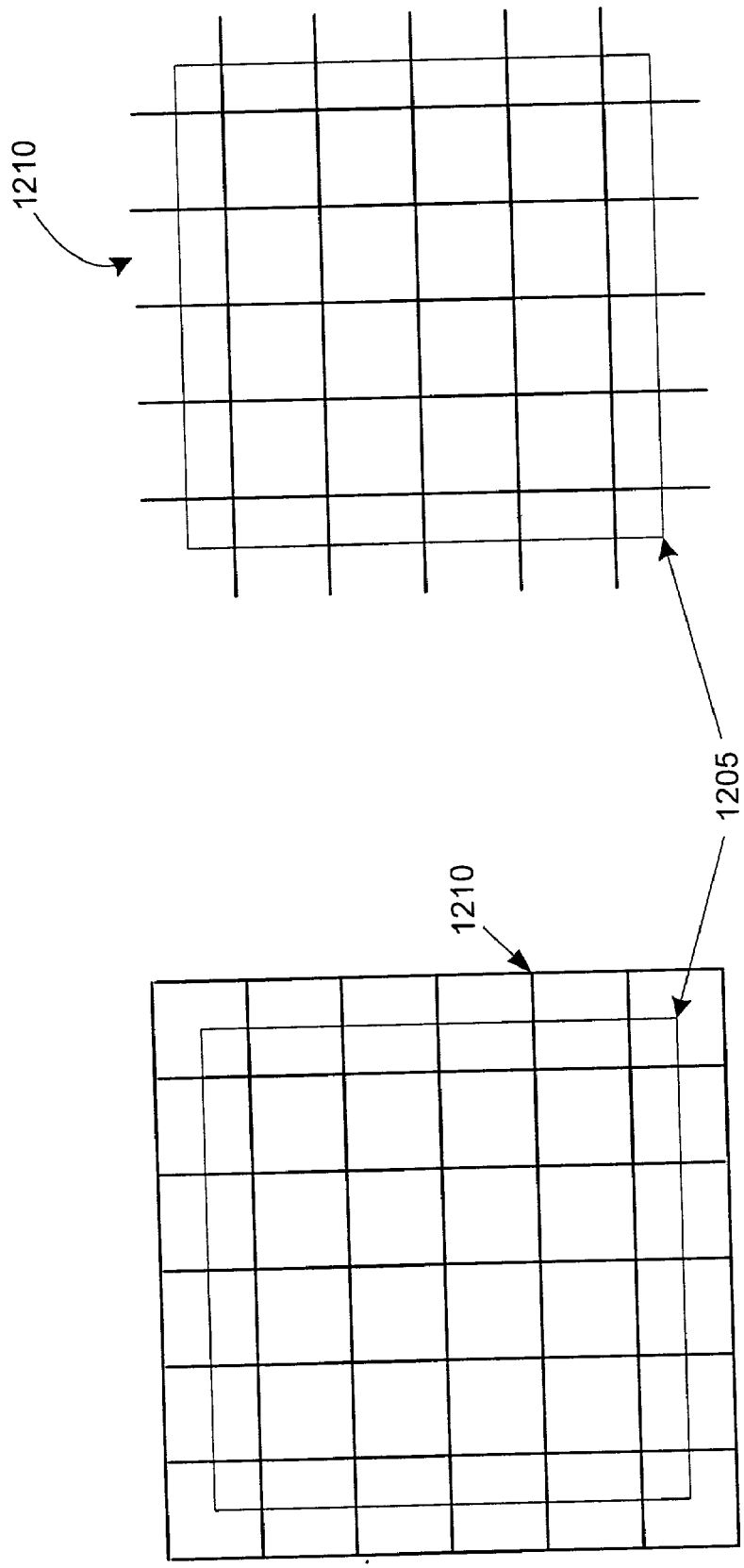
FIG. 13 presents an example of a division of an IC layout by a number of rectangular tiles.
FIG. 14 presents an example of the tiles that cover the exterior sides of the IC layout extended to infinity.

Finally, the process (at 1150) divides the IC layout into a number of tiles based on the selected tile size. FIG. 13 presents an example of a division of an IC layout 1205 by a number of rectangular tiles 1210. In some embodiments of the invention, the exterior tiles (i.e., the tiles that cover the exterior sides of the IC layout) are extended to infinity, in order to protect against numerical round-off errors. FIG. 14 presents an example of such an approach.

1. Predicting the Actual Number of Segments Per Tile:

Some embodiments of the invention do not actually compute (at 1120) the number of segments $N_i$ per tile, but instead predict the average number of segments $\mu$ per tile. Some of these embodiments use the following equation (5) to compute the estimated number of segments, $\mu$.

$$\mu = \frac{n_S[a_S + w_S(2d + h_B) + h_S(2d + w_B) + (2d + h_B)(2d + w_B)]}{wh} \quad (5)$$

In this equation, $n_S$ is the total number of the segments, $a_S$ is the mean area of the segments, $w_S$ is the mean width of the segments, $h_S$ is the mean height of the segments, $w_B$ is the width of each tile, $h_B$ is the height of each tile, $w$ is the total width of the IC, and $h$ is the total height of the IC.

Figure 15:
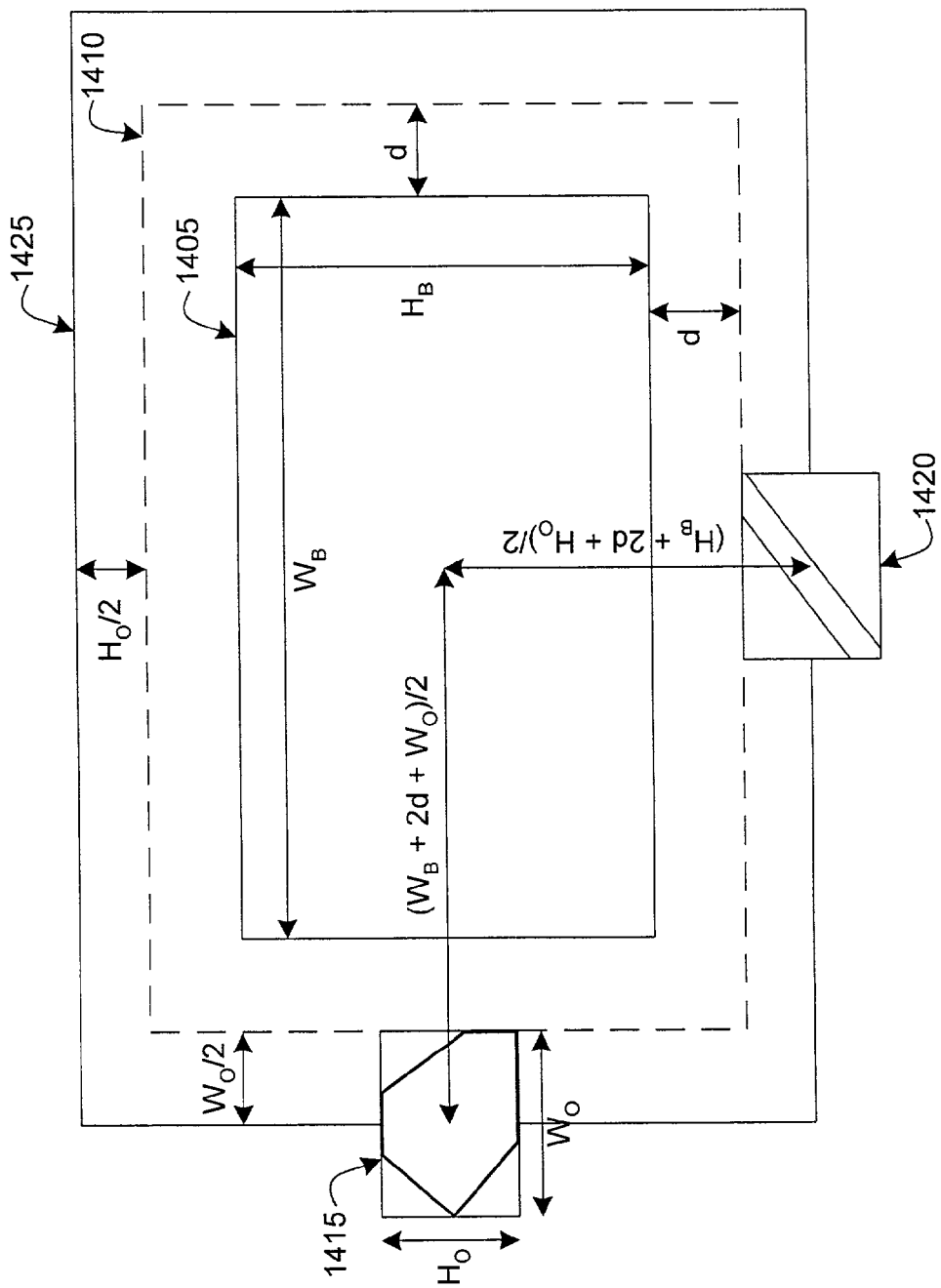
FIG. 15 aids in the description for predicting the number of segments in a tile region.

Equation (5) is based on the assumption that the position of each segment in the IC layout is random. FIG. 15 illustrates how this equation was derived. This figure illustrates a particular tile 1405, the tile's halo boundary 1410, and two segments 1415 and 1420. The tile 1405 has a width of $w_B$ and a height of $h_B$, while the tile's halo boundary has a width of $w_B+2d$ and a height of $h_B+2d$. The two segments both have an effective width $w_0$ and height $h_0$.

As further discussed below, an interconnect segment must fall within the tile 1405 or its halo boundary 1410 for insertion into the tile's ng tree. As shown in FIG. 15, the segments 1415 and 1420 fall just outside of the halo boundary 1410 of the tile. This is because the center of segment 1415 is a distance $(w_0+2d+w_B)/2$ away from the center of the tile, while the center of segment 1420 is a distance $(h_0+2d+h_B)/2$ away from the center of the tile.

Hence, in order for a segment with a width $w_0$ and height $h_0$ to fall within the halo boundary 1310 of the tile, the center of this segment must fall within a rectangle 1425 centered at the tile and having width $w_0+2d+w_B$ and height $h_0+2d+h_B$. Because the position of each segment in the IC layout is random, the probability P that such a segment overlaps the tile is equal to the area of rectangle 1425 divided by the area of the IC. Equation (6) illustrates this probability.

$$P = \frac{(w_0 + 2d + w_B)(h_0 + 2d + h_B)}{wh} \quad (6)$$

Equation (7) below is obtained by expanding the formula for the probability that a given segment overlaps a given tile.

$$P = \frac{[w_0h_0 + w_0(2d + h_B) + h_0(2d + W_B) + (2d + h_B)(2d + w_B)]}{wh} \quad (7)$$

The average number of segments per tile may be obtained by using equation (7) to calculate the probability for all the segments and by summing the calculated probabilities. Equation (8) explains this operation mathematically.

$$\mu = \sum_{n_S} P_1 = \quad (8)$$

$$\sum_{n_S} \frac{[w_0h_0 + w_0(2d + h_B) + h_0(2d + w_B) + (2d + h_B)(2d + w_B)]}{wh}$$

The sum of $w_0h_0$ becomes $n_S a_S$, while the sum of $w_0$ becomes $n_S w_S$, and the sum of $h_0$ becomes $n_S h_S$. Hence, equation (8) can be simplified into equation (9) below:

$$\mu = \sum_{n_S} P_1 = \frac{[n_S a_S + n_S w_S(2d + h_B) + n_S h_S(2d + w_B) + n_S(2d + h_B)(2d + w_B)]}{wh} \quad (9)$$

By factoring out the variable $n_s$, Equation (5) is derived from Equation (9). As set out in equation (10) below, the formula for $\mu$ may also be given in terms of the total area $A_S$ of the segments, the total width $W_S$ of the segments and the total height $H_S$ of the segments as follows:

$$\mu = \frac{[A_S + W_S(2d + h_B) + H_S(2d + w_B) + n_S(2d + h_B)(2d + w_B)]}{wh} \quad (10)$$

As further described below, in some embodiments, a segment might result in multiple data-tuple entries into the ng tree of a particular tile. Whether a segment requires multiple data-tuple entries depends on: (1) the number of tile boundaries that the segment crosses; and (2) the manner that the data structure treats segments that are close to or cross tile boundaries; and (3) the particular implementation of the halo boundary surrounding the tile.

Equations (5) and (10), however, do not account for the multiple data-tuple entries into the ng tree for such segments. These equations assume that such multiple entries minimally affect the average number of segments per tile. These equations, however, may be modified by adding a constant multiplier (e.g., such as a multiplier of 1.1 or 1.2) to account for the increase in the number of segments per tile due to the segments that cross halo and tile boundaries. This multiplier can be larger for the smaller tile sizes because smaller tiles result in more segment crossings.

Figure 16:
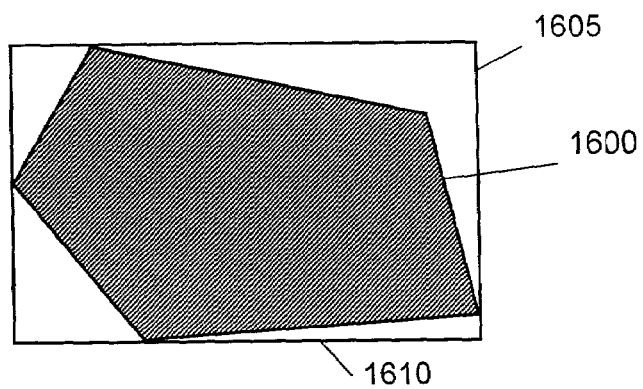
FIG. 16 illustrates an example of a polygon replaced with a smallest axes-aligned rectangle for purposes of computing a tiling grid.

In one embodiment for processing geometric objects (e.g., convex polygons) to determine a tile grid, segment data for the geometric objects is replaced with the smallest axes-aligned rectangle that contains the geometric segment. FIG. 15 illustrates this technique by replacing the six-sided polygon 1415 with a smallest axes-aligned rectangle, and by replacing the oblique rectangle 1420 with a smallest axes-aligned rectangle. FIG. 16 illustrates an example of a polygon replaced with a smallest axes-aligned rectangle for purposes of computing a tiling grid. For this example, the segment is a five-sided polygon 1600. To calculate a tiling grid, an axes-aligned rectangle 1605 that encompasses the polygon 1600 is generated as shown in FIG. 16. In one embodiment, the geometric objects (e.g., polygon 1600) are represented as an order collection of vertex points. Thus, the axes-aligned rectangle may be determined by finding the minimum and maximum X and Y coordinates among the vertices of the geometric object.

The process 700 has numerous advantages. For instance, the time that this process expends on constructing its two-layered data structure increases linearly with the number of data tuples in the data space. The following example illustrates this point. As discussed above, the time for constructing a ng tree with N data tuples is proportional to $N\log_2 N$. However, if the data space is divided into two data regions and each data region roughly contains N/2 data tuples, the time for constructing a ng tree for each data region is proportional to $\frac{1}{2}N\log_2(N/2)$. Hence, the time for constructing an ng tree for both data regions is proportional to $N\log_2(N/2)$, which is better than $N\log_2(N)$.

Similarly, if the data space is divided into R data regions with each data region containing roughly N/R data tuples, the time for constructing ng trees for all the data regions is proportional to $N\log_2(N/R)$. Equation (3) below explains this mathematically.

$$\text{Total run time} \propto \sum_R \frac{N}{R} \log_2 \frac{N}{R} = N \log_2 \frac{N}{R} \ll N \log_2 N \quad (3)$$

Hence, dividing the multidimensional data space into a number of data regions R reduces the total construction time. This reduction can be significant if the number of data regions R is on the same order as the number of tuples N. In fact, the construction time can be made to increase linearly with the number of data tuples N, by increasing the number of data regions R linearly with the number of data tuples N. For example, if R is selected so that it is always equal to N/1000, then the construction time will always be proportional $N\log_2(1000)$.

F. Constructing a Two-Dimensional Array of Tiles:

As shown in FIG. 11, the process 1000 constructs a two-dimensional array of tile data structures after the IC layout is divided into a number of tile regions along the x- and y-axes. Each particular tile data structure represents a particular tile region. In some embodiments of the invention, each tile data structure is a tile data object (i.e., an instantiation of a tile data class). Moreover, some embodiments construct the array as a two-dimensional array of tile data objects. In these embodiments, two index values identify the location of each tile data object in the two-dimensional array. Other embodiments, however, construct this array as an array of pointers, where each pointer points to a particular data object. In these embodiments, the two index values identify the location of a pointer that points to the tile data object.

FIG. 10 illustrates the tile data structure 910 that is used in some embodiments of the invention. This tile data structure 910 represents a tile by specifying one main rectangle ("MRec"), one to four halo rectangles ("HRec"), and one bounding box ("bbox") rectangle.

Figure 17:
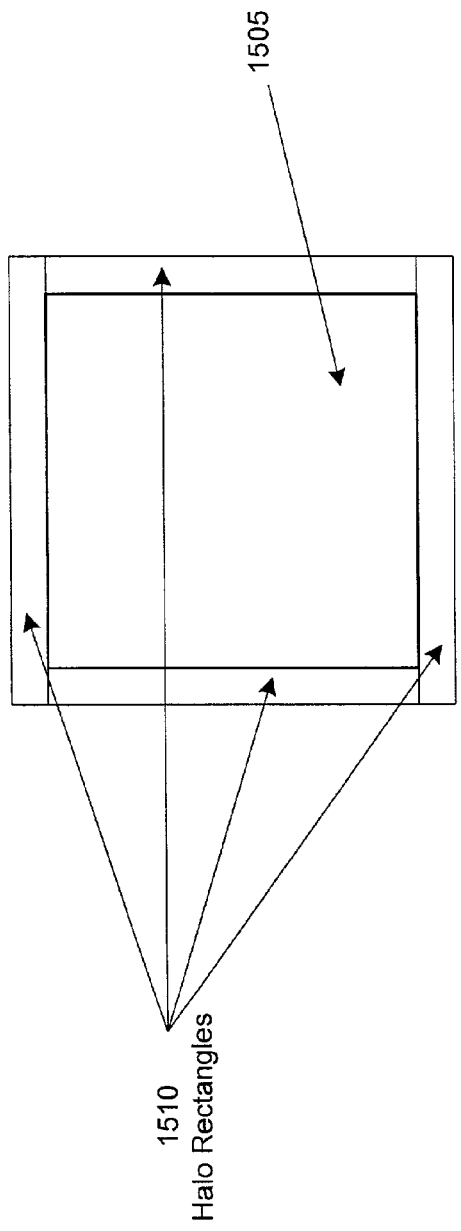
FIG. 17 illustrates an example tile that has four halo rectangles.
Figure 19:
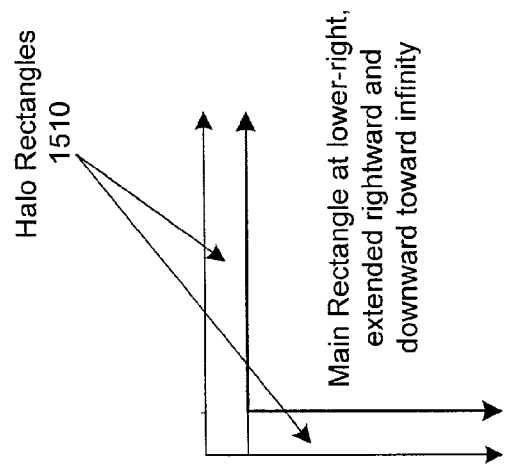
FIG. 19 illustrates an example tile that has two halo rectangles.
Figure 18:
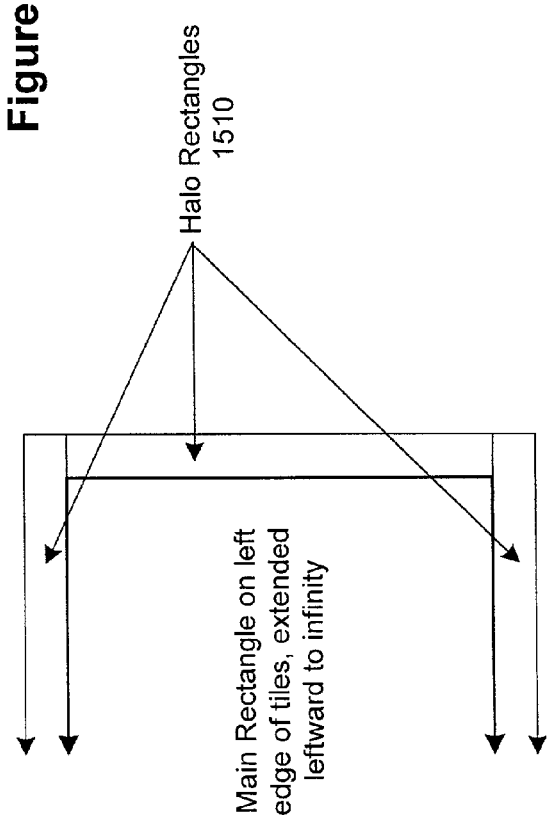
FIG. 18 illustrates an example tile that has three halo rectangles.

As shown in FIGS. 17–19, the main rectangle 1505 is the tile rectangle that is specified by the tile-defining process of FIG. 12, while the halo rectangles 1510 correspond to halo regions that surround the tile. The halo regions are used to identify non-source interconnect lines. As described above, non-source interconnect lines are lines that fall outside of a tile (or main) rectangle 1505. Non-source interconnect lines are necessary for the analysis of interconnect lines within the tile. For example, when extracting capacitances influenced by a particular source interconnect line that is close to its tile's edge, it might be necessary to look for non-source interconnect lines outside of the tile, because such interconnect lines may lie within the halo distance of the particular interconnect line. The halo regions provide one solution for identifying non-source interconnect lines. As described below, some embodiments of the invention insert into the tile's hierarchical data structure a copy of the non-source interconnect lines that fall within the halo rectangle 1510 of the tile.

In some embodiments of the invention, a typical tile has four halo rectangles, as shown in FIG. 17. However, the tiles at the periphery of the chip have fewer halo rectangles. For example, as shown in FIG. 18, a tile in the middle of the outside edge of the IC layout has only three halo rectangles, two of which extend to infinity in the embodiments that extend the outer tiles to infinity. Also, as shown in FIG. 19, a tile in the lower-right corner of the IC layout only has two halo rectangles, both of which extend to infinity in the embodiments that extend the outer tiles to infinity. In the extreme case of a chip containing only two tiles, each would have a single halo rectangle. In addition, there is no halo rectangles in the extreme case of a chip containing only a single tile.

The bounding box rectangle encloses the tile's main and halo rectangles. As described further below, the bounding box rectangle is used to quickly identify all the interconnect lines that intersect the tile's main and halo rectangles. These identified interconnect lines can then be inserted as source or non-source interconnect lines in the hierarchical data structure of the tile.

As shown in FIG. 10, the title data structure represents the main, halo, and bounding-box rectangles by their minimum x ($X_{MIN}$), minimum y ($Y_{MIN}$), maximum x ($X_{MAX}$), and maximum y ($Y_{MAX}$) coordinates. The data structure also includes a counter for specifying the number of halo rectangles the tile has (i.e., the number of valid halo rectangles in the tile data structure). The data structure further includes a pointer 920 to the first segment inserted into the data structure. Finally, the data structure includes a pointer 925 to the root node of the tile's ng tree.

G. Inserting Geometric Segments into the Tile Data Structure:

As shown in FIG. 11, the process 1000 inserts (at 1015) each interconnect segment into one or more of the tile data structures after it constructs a two-dimensional array of tile data structures. To insert an interconnect segment into a tile data structure, the process must first determine whether the interconnect segment crosses the boundaries of the main or halo rectangles of the tile data structure. If so, the process must break the interconnect segment into one or more pieces along the boundaries that it crosses. The resulting pieces are discarded if they are outside the tile's bounding box, or inserted in the tile data structure as a source or non-source segment if the portion of the segment falls within the tile's boundary box.

In one embodiment, the exact intersection of the polygon with the main or halo rectangle is determined for use as the segment data. Currently, algorithms exist to determine this intersection (see "Computational Geometry in C", O'Rourke, Cambridge University Press, 1993, reprinted in 1996 with corrections from 1994 reprint, Section 7.4, page 243).

In another embodiment, to determine whether the interconnect segment crosses the boundaries of the main or halo rectangles, a smallest axes-aligned rectangle that contains the geometric object (e.g., polygon) is calculated. For this embodiment, the process approximates the dimensions of the geometric object. The method determines the superset of the set of tiles intersected by the polygon. In some cases, this superset is too large, thus considering more segment data than necessary. For example, if the segment data defines a narrow rectangle oblique to the tile grid, then replacing this segment data with the smallest axes-aligned rectangle results in including irrelevant tiles, and thus impedes processing. In other embodiments, the intersection of convex polygons to the tile grid is determined.

Figure 20:
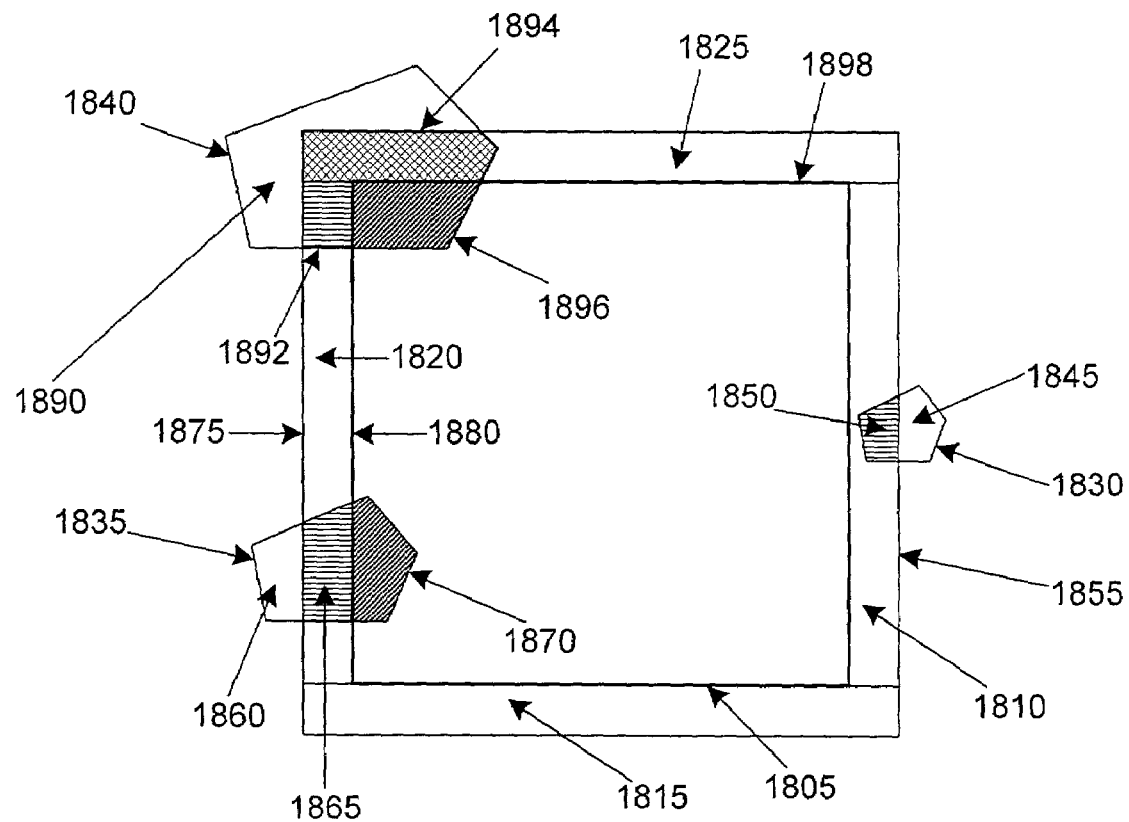
FIG. 20 pictorially illustrates the breaking up of three segments along the boundaries of a tile.

FIG. 20 pictorially illustrates the breaking up of three segments along the boundaries of a tile 1805. This tile has four halo rectangles 1810, 1815, 1820, and 1825 that surround it. As shown in FIG. 20, segment 1830 intersects the halo rectangle 1810. The segment 1830, however, does not intersect the main tile rectangle 1805. Hence, this segment is only divided into two parts, 1845 and 1850 along the boundary 1855 of the halo rectangle 1810. Part 1845 is discarded as it falls outside the tile's bounding box, while part 1850 is selected as a non-source segment to insert into the tile's data structure.

Another segment illustrated in FIG. 20 is segment 1835. This segment intersects the main rectangle 1805 and the halo rectangle 1820 of the tile. Hence, this segment is divided into three parts 1860, 1865, and 1870 along the boundaries 1875 and 1880 of the halo and main rectangles. Part 1860 is discarded as it falls outside the tile's bounding box, part 1865 is selected as a non-source segment to insert into the tile's data structure, and part 1870 is selected as a source segment to insert into the tile's data structure.

The final segment illustrated in FIG. 20 is segment 1840. This segment intersects the main rectangle 1805 and the halo rectangles 1820 and 1825 of the tile. Hence, this segment is divided into four parts: 1890, 1892, 1894, and 1896 along the boundaries 1875, 1880, and 1898 of the main and halo rectangles 1805, 1820, and 1825. Part 1890 is discarded as it falls outside the tile's bounding box. Parts 1892 and 1894 are identified as non-source segments and inserted into the tile's data structure. Part 1896 is selected as a source segment to insert into the tile's data structure.

Figure 21:
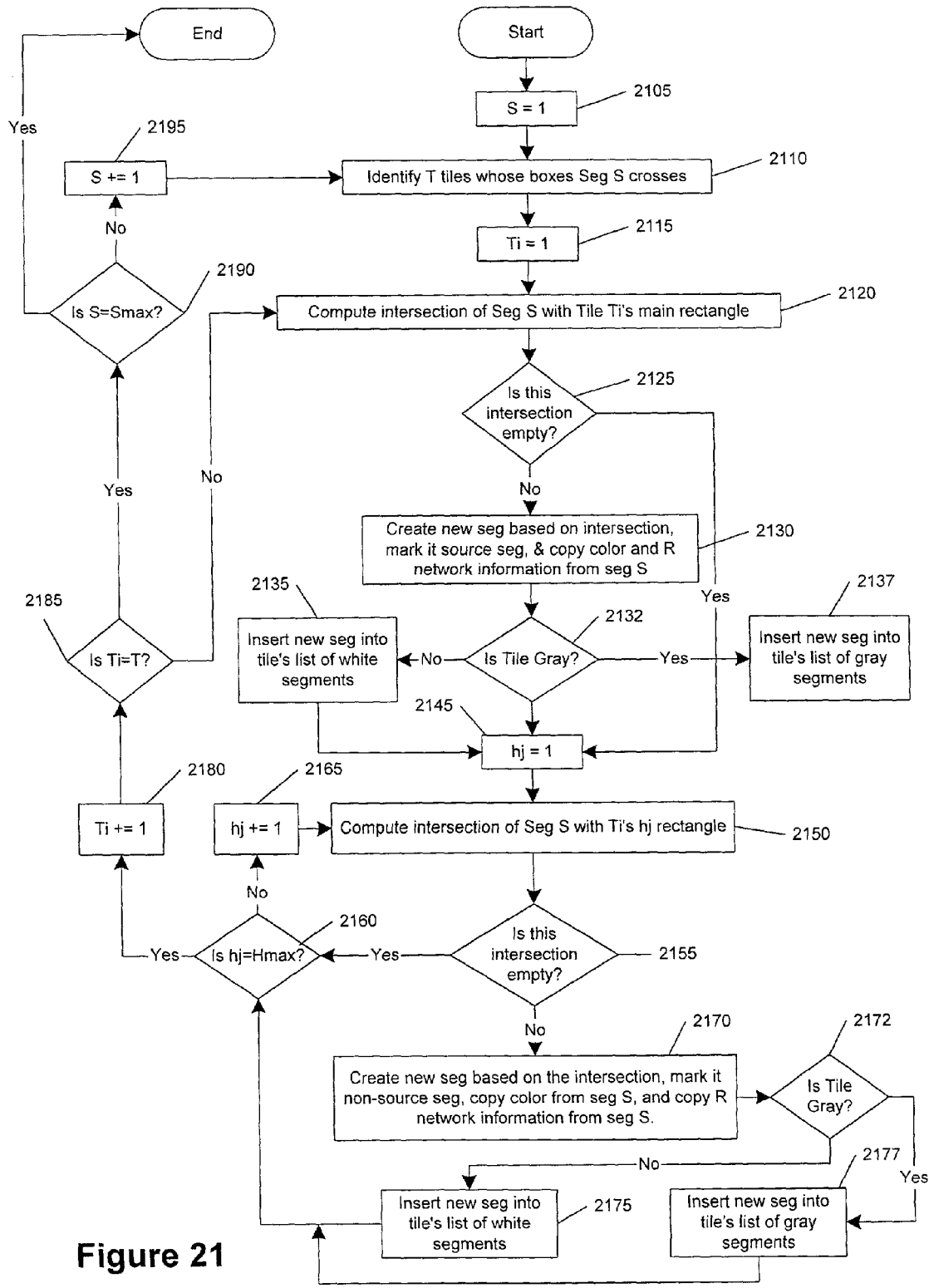
FIG. 21 illustrates one embodiment for a process that inserts interconnect segments into one or more tile data structures.

FIG. 21 illustrates one embodiment for a process that inserts interconnect segments into one or more tile data structures. As shown in this figure, the process (at 2105) initially sets a segment number S equal to 1. Next, the process (at 2110) identifies all tiles that segment S intersects. Based on these calculations, the process retrieves one or more tile data structures from the two-dimensional array 905.

After identifying the tiles that the segment intersects, the process (at 2115) sets the tile count $T_1$ equal to 1. The process (at 2120) then computes the intersection of the segment S with the main rectangle of the tile $T_i$. Some embodiments of the invention use existing algorithms to compute the intersection of a polygon with a rectangle.

Next, the process (at 2125) determines whether this intersection is empty. If so, the process transitions to step 2145. If not, the process (at 2130) creates a new segment based on the intersection of the segment, S, with the main rectangle of the tile, $T_1$.

Figure 22:
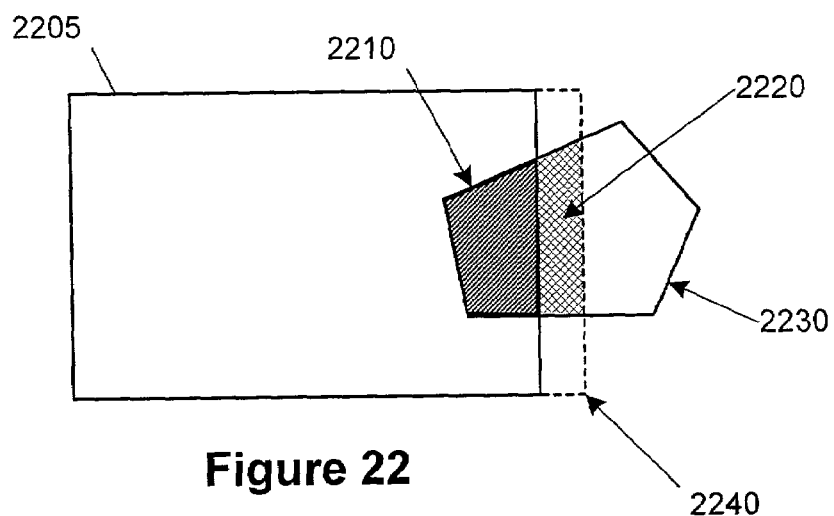
FIG. 22 illustrates one example for determining new source segments and new non-source segments for a polygon.

In order to create a new segment for insertion into the tile, a new source segment is determined based on the intersection of the segment data with the tile's main rectangle. A new non-source segment is the intersection of the original segment with a halo rectangle. There are several embodiments for creating new segments based on the intersection of the polygon segment data with main and halo rectangles. In one embodiment, the new source segment is defined as the exact intersection of the polygon segment with the tile's main rectangle. FIG. 22 illustrates one example for determining new source segments and new non-source segments for a polygon. This example includes a halo rectangle 2240 and a main rectangle 2205. As shown in FIG. 22, a polygon includes a new source segment 2210 bounded by main rectangle 2205. A new non-source segment is created between the area of the halo rectangle 2240 and the main rectangle 2205. A third segment, labeled 2230, is not part of either the main or halo rectangle, and therefore is discarded.

Figure 23:
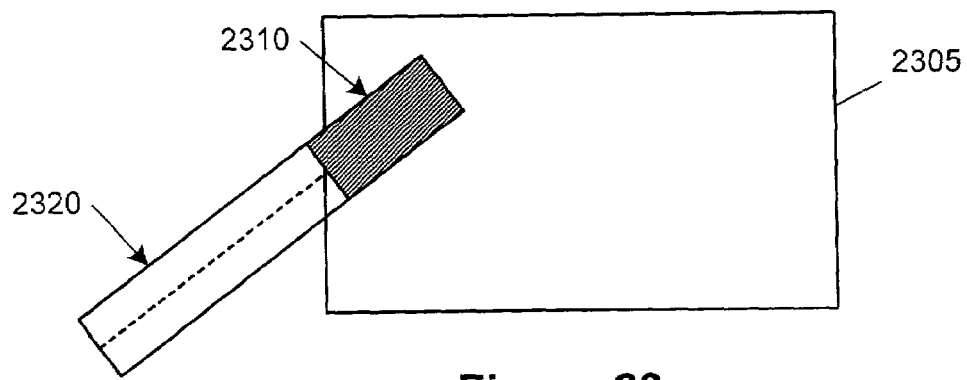
FIG. 23 illustrates one embodiment for estimating a segment rectangle estimated by a bounding rectangle.

In another embodiment, if the polygons are rectangles, then the new segment may be approximated by another rectangle equal to the intersection of a halo or main rectangle. FIG. 23 illustrates one embodiment for estimating a segment rectangle estimated by a bounding rectangle (e.g., halo or main rectangle). For this example, a new segment rectangle 2310 is estimated based on its intersection with bounding box 2305. The segment 2320 is discarded for purposes of this calculation. For this embodiment, the boundary of the new source rectangle is determined by extending a center line perpendicular to the end of segment 2310 at the point where the segment crosses the boundary of the bounding box.

Figure 24:
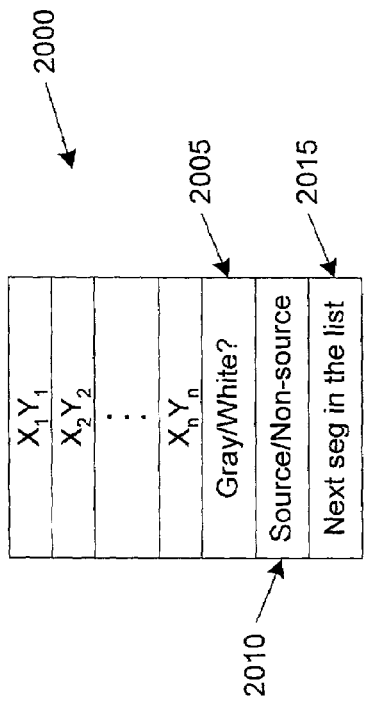
FIG. 24 illustrates a segment data structure.

To specify a new segment area, the process creates new segment data structure 2000, which is illustrated in FIG. 24. This data structure defines the new polygon area by its vertices (e.g., $X_0, Y_0, X_1, Y_1, \ldots X_n, Y_n$). In one embodiment, the segment data structure for a polygon also includes a field 2010 that specifies whether the area is a source or non-source area. The process (at 2130) marks the new area as a source area since it is in the main rectangle of the tile. In another embodiment, the data structure 2000 further includes a field 2005 that specifies whether the rectangle is white or gray (i.e., critical or not), and the process (at 2030) specifies the new area as a white or gray area depending on the corresponding attribute of the segment S. The data structure 2000 also includes a pointer 2015 to link the new area to another area or segment in a list.

In one embodiment, if the critical/non-critical attribute is used, the process (at 2132) determines whether the new segment is gray (i.e., based on the information from segment S). If the new segment is gray, then the process (at 2137) inserts the new area in the list of gray segments for tile, $T_i$. If the new segment is not gray, then the process (at 2135) inserts the new area in the list of white segments for tile, $T_1$. In other embodiments, the critical/non-critical attribute is not used (e.g., graphics application), then the process transitions from block 2130 to block 2135.

Figure 25:
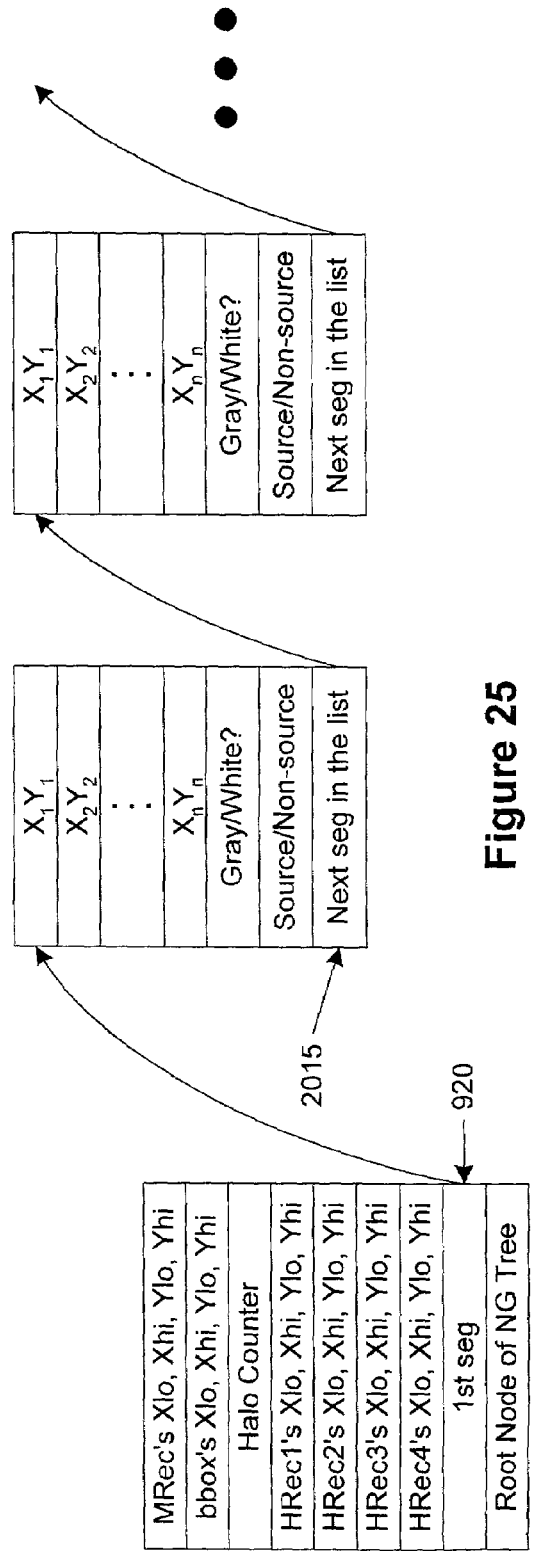
FIG. 25 illustrates linking the pointer of the tile data structure to the new area.

In one embodiment, as shown in FIG. 25, the new rectangle is inserted by linking the pointer 920 of the tile data structure 910 to the new area, if the new area is the first area inserted into the tile data structure. Otherwise, the new area is inserted by linking the pointer 2015 of the last-inserted area to the new area.

After inserting the new area, the process (at 2145) sets the halo-rectangle number, $H_J$, to 1. The process (at 2150) then computes the intersection of the segment S with the halo rectangle $H_J$ of the tile $T_1$. Embodiments for computing the intersection of a polygon with a rectangle are described above. Next, the process (at 2155) determines whether this intersection is empty. If so, the process transitions to step 2160.

If not, the process (at 2170) creates a new area based on the intersection of the segment S with the halo rectangle $H_J$ of the tile $T_1$. One embodiment for creating a new area based on the intersection of a polygon and a rectangle is described above. The data structure of this new area is identical to that shown in FIG. 24. Hence, the process creates the new area by specifying its vertices (e.g., $X_0, Y_0, X_1, Y_1, \ldots X_n, Y_n$).

The process also specifies the new area as a non-source segment since it is in the halo region of the tile. The process further specifies the new area as a white or gray (i.e., critical or non-critical) area depending on the corresponding attribute of the segment S.

Next, the process (at 2175) inserts the new area in the data structure for tile $T_1$. As before, if another area has already been inserted in this tile data structure, the new area is inserted by linking the pointer 2015 of the last-inserted area to the new area. Otherwise, the new area is inserted by linking the pointer 920 of the tile data structure 910 to the new area.

The process (at 2160) determines whether the halo rectangle number, $H_J$, equals the halo counter value of the segment S. If not, the process (at 2165) increments the halo rectangle number $H_J$ by 1, and then transitions back to step 2150 for the next halo region of tile, $T_1$. Otherwise, the process (at 2180) increments the tile number $T_1$ by 1, and then determines (at 2185) whether all the identified tiles were examined. If not, the process transitions to step 2120 to repeat the process for the next intersected tile.

On the other hand, if all the identified tiles were examined, the process determines (at 2190) whether all the segments have been examined. If so, the process ends. Otherwise, the process (at 2195) increments the segment number S, and then identifies (at 2110) all tiles that the new segment S intersects. The process is then repeated for the new segment S.

H. Creating an Ng Tree for Each Tile:

As shown in FIG. 11, the process 1000 creates (at 1020) an ng tree for each tile region after it inserts the interconnect segments into the tile data structures. Each ng tree efficiently organizes the data relating to the interconnect segments in its tile. Some embodiments of the invention use a two-step process to create an ng tree for a tile. First, for this embodiment, each inserted segment is converted into an ng node. Second, the ng nodes are connected to build an ng tree. These processes are described above in conjunction with FIGS. 6, 7 and 8.

Figure 26:
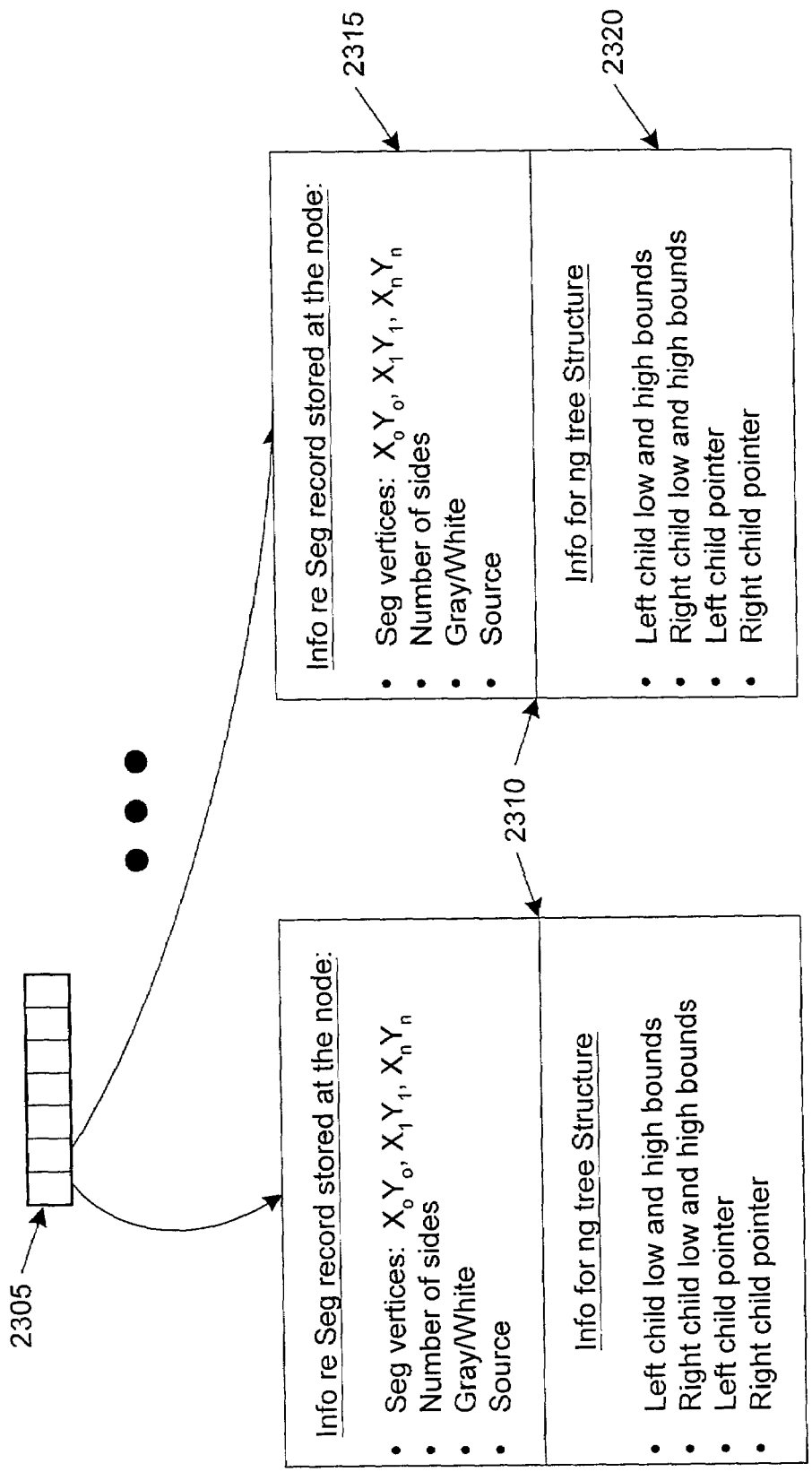
FIG. 26 illustrates one manner for constructing an ng node array.

FIG. 26 illustrates one manner for constructing an ng node array. As shown in FIG. 26, some embodiments create an ng node array by creating a one-dimensional pointer array 2305 and an ng node 2310 for each pointer in the array. Each pointer in the array points to a unique ng node. Some embodiments create the ng node array by only creating the one-dimensional pointer array 2305.

In some embodiments of the invention, each ng node is an ng node object (i.e., an instantiation of an ng node class). FIG. 26 illustrates the data structure for an ng node. As shown in this figure, each ng node has two sets of fields. The first set 2315 include fields to contain data regarding the segment inserted into the node. This data includes the segment's vertices, number of sides, its source or non-source status, and its critical or non-critical status.

The second set of fields 2320 includes fields that are necessary for building and traversing the ng tree. For instance, it includes outside and inside child pointers for pointing to the outside and inside children of the node. These pointers are initialized as NIL pointers. This second set also includes the children nodes' low and high dimension values along the node's discriminator dimension. The node's discriminator dimension depends on the node's level in the tree, and hence is determined when the tree is being built. The low and high dimension values speed up the process for traversing the tree.

Figure 27:
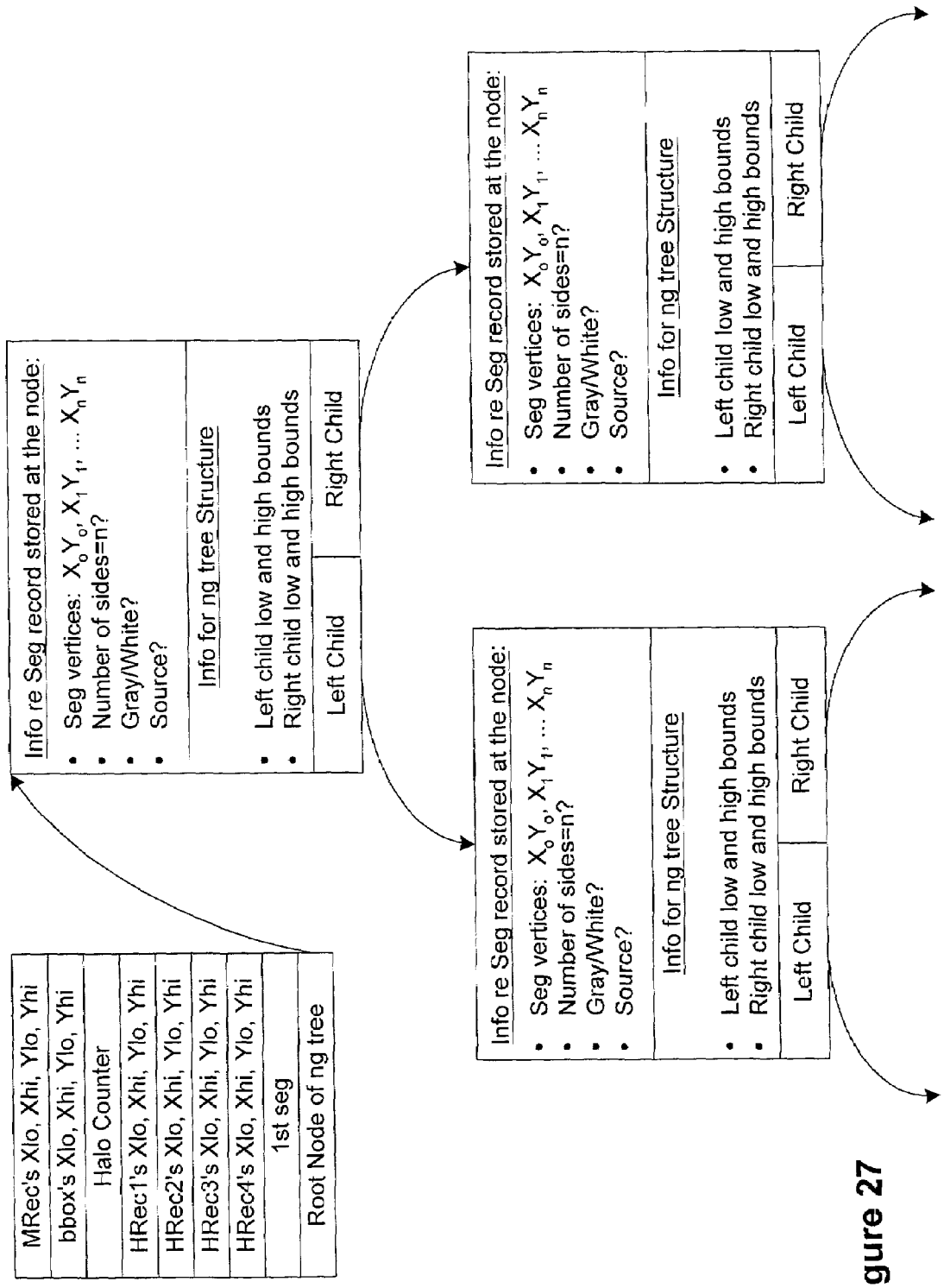
FIG. 27 presents a tile data structure with its associated ng tree.

FIG. 27 presents a tile data structure with its associated ng tree. This figure illustrates how the tile data structure identifies the root of the ng node, and how the root ng node connects to its child nodes through its outside and inside child pointers.

Figure 28:
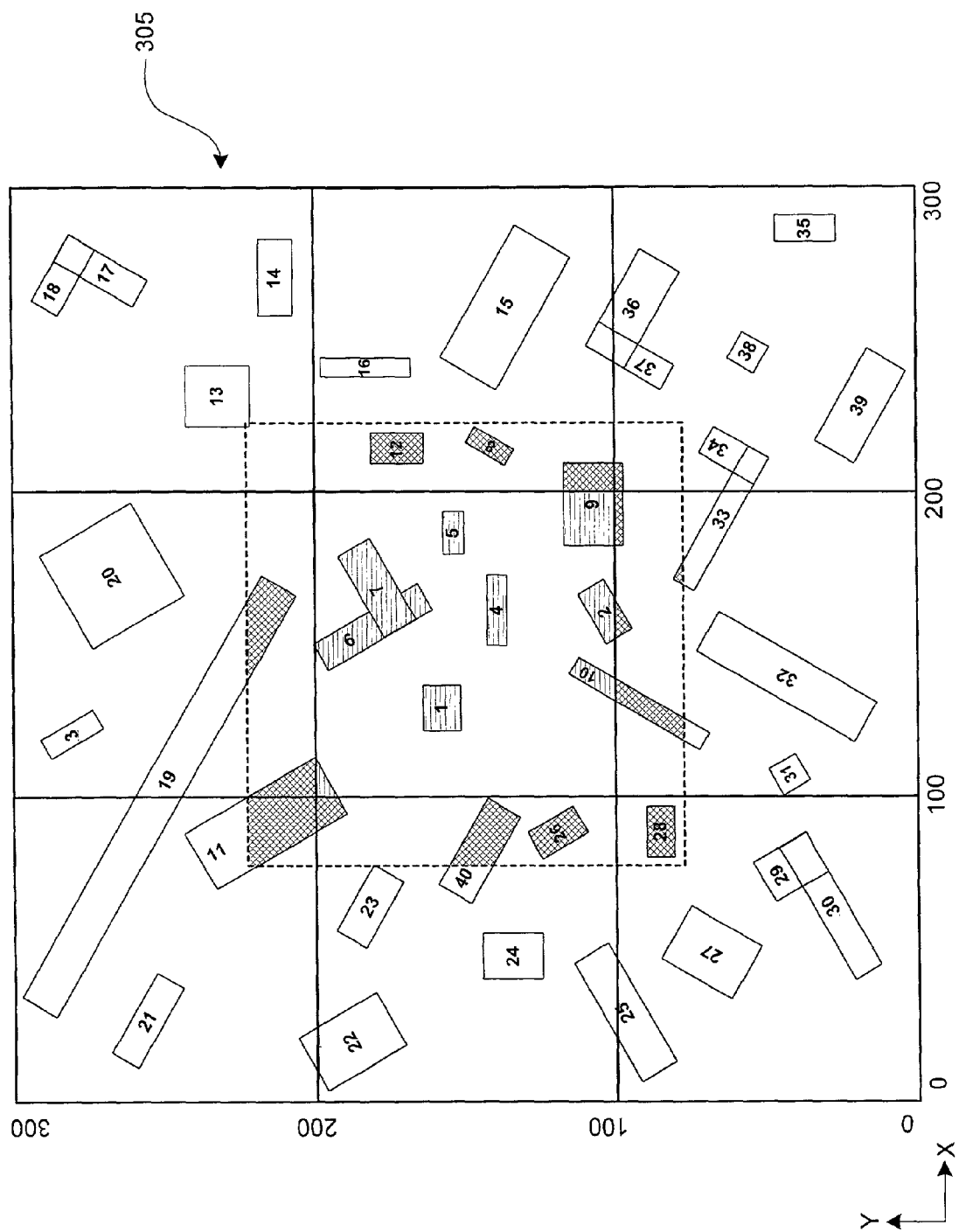
FIG. 28 illustrates one manner of partitioning the IC layout of FIG. 3.

FIG. 28 illustrates one manner of partitioning the IC layout 305 of FIG. 3. In this figure, the IC layout 305 is partitioned along the x- and y-axes into nine square tiles. The layout is divided into these square tiles by two row lines defined by y-dimension values 100 and 200, and two column lines defined by x-dimension values 100 and 200. FIG. 28 also shows the halo rectangles (dashed lines) that surround the main rectangle. Portions of the rectangle segments in FIG. 28 that are encompassed by the main rectangle or the halo rectangle are marked to show the new segments created as set forth in the process of FIG. 21. For example, rectangle segment 10 includes a first new segment to define the intersection with rectangle 10 with the main rectangle, and a second new segment to define the intersection of rectangle 10 with the halo rectangle.

Range Queries:

EDA applications can use the two-layered data structure 900 to speed up capacitance extraction operations. In particular, EDA applications can use this two-layered data structure to quickly identify interconnect lines with a certain distance (i.e., a halo distance) of critical interconnect lines. These identified interconnect lines can then be used to compute the capacitances exerted on the critical interconnect lines.

Figure 29:
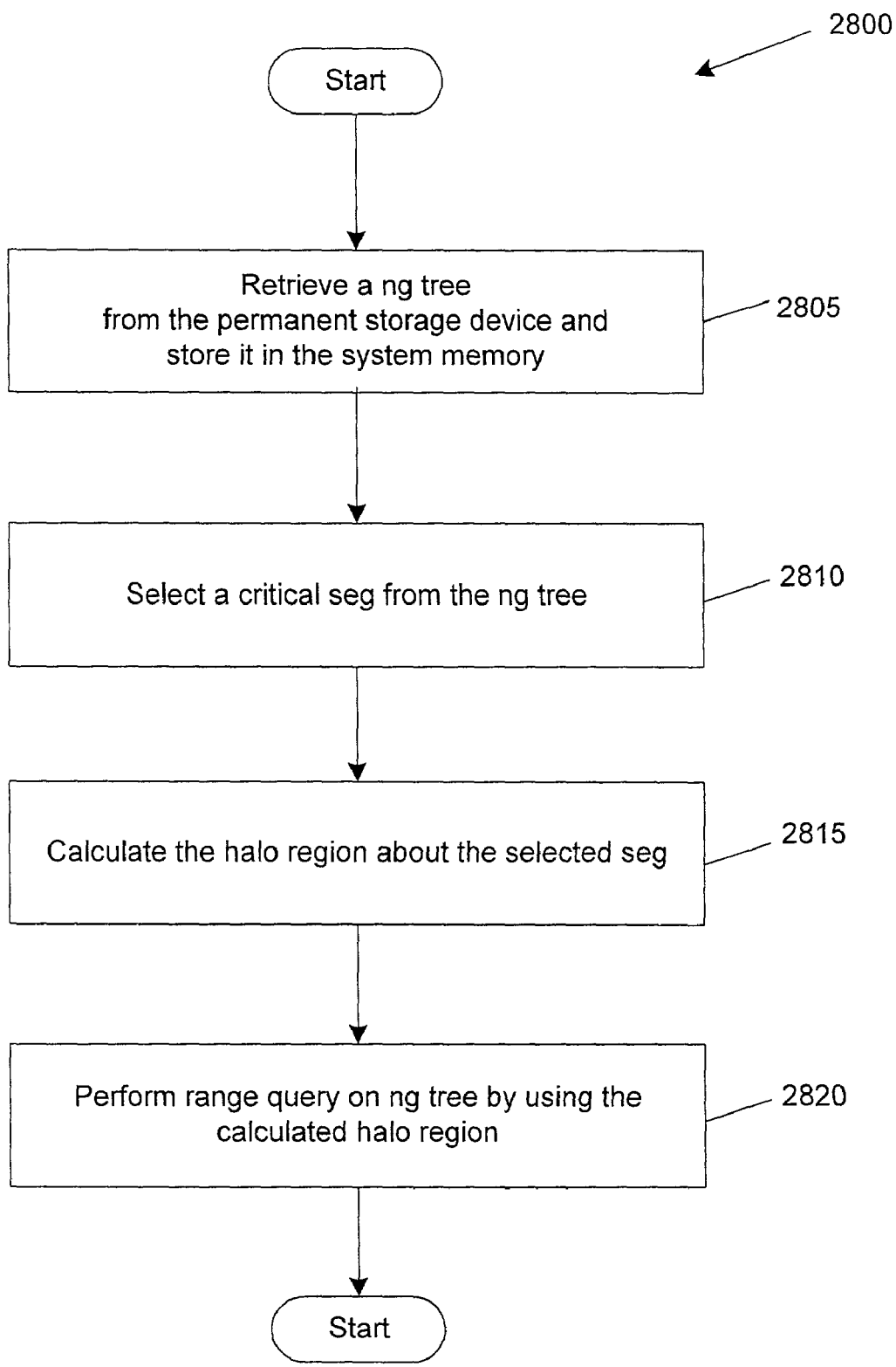
FIG. 29 illustrates one process that is used in some embodiments of the invention to identify the interconnect lines within a halo distance of a critical interconnect line.

FIG. 29 illustrates one process that is used in some embodiments of the invention to identify the interconnect lines within a halo distance of a critical interconnect line. This process (at 2805) initially retrieves an ng tree from the permanent storage device 825, and stores this ng tree in the system memory of the computer system. Next, the process (at 2810) selects a critical interconnect segment in the retrieved ng tree.

The process (at 2815) then calculates the halo region surrounding the selected segment. In some embodiments of the invention, this halo region is defined as a rectangle that has its centered aligned with the segment's center, and has its vertical and horizontal sides a halo distance d away from the segment's vertical and horizontal sides respectively.

Next, the process (at 2820) uses the calculated halo region as a range-query window to perform a range query on the ng tree of the selected segment. In some embodiments of the invention, the process 2800 uses known techniques for traversing the tree and performing a range query on the ng tree. For instance, the process makes branching decisions at each node by determining whether that node's discriminator value falls below, above, or within the query range along that node's discriminator dimension. The process examines: (1) the node's outside subtree when the node's discriminator value is inside the half plane for the query range, (2) the node's inside subtree when the node's discriminator value is outside the half plane for the query range, and (3) the node's outside and inside subtrees when the node's discriminator value falls within the query range.

As discussed above by reference to FIG. 27, each node in the ng tree specifies the low and high dimension values (along the node's discriminator dimension) of the nodes in its outside and inside subtree. Consequently, the process 2800 can use these low and high dimension values at each node to determine whether it would be useful to examine the subtrees originating from a node. For instance, if a node's discriminator value falls outside the plane of the query range, the process can examine the low bound of the node's outside subtree to determine whether the lowest value in that subtree is also above the query range along that node's discriminator. If so, the process does not need to examine the outside subtree since all the segments in this subtree are above the query range along that node's discriminator.

Each time the process 2800 encounters a node whose discriminator value falls within the query range, the process determines whether the remaining coordinates of the segment stored at that node fall within its range query window. In essence, the process compares the coordinates of the segment stored at that node with the coordinates of its range-query window. If the segment falls within this range-query window, the process returns this segment's data.

Some embodiments of the invention perform process 2800 for all critical (i.e., white) source segments in all the ng trees. In fact, some embodiments sequentially perform this process for all critical source segments in a retrieved ng tree, before retrieving another ng tree to analyze its segments.

One of ordinary skill in the art will understand that the invention's two-layer data structure 900 has numerous advantages. For instance, as discussed above, it speeds up the capacitance extraction operation, because it allows an EDA application to identify quickly all interconnect lines near a particular critical line by simply analyzing one small ng tree. Only one small ng tree needs to be examined for each critical segment, since each segment is stored in a small ng tree with all the interconnect lines that might capacitively couple to it.

Dividing the IC layout into smaller regions, and creating relatively smaller ng trees to store the segment data in each region, also allows the total query runtime to increase linearly with the number of interconnect segments in the layout. The runtime for performing N queries for N segments in a ng tree is proportional to $Nlog_2N$. However, if the IC layout is divided into two regions and each region roughly contains N/2 segments, the time for performing range queries about all the segments in each region is proportional to $\frac{1}{2}Nlog_2(N/2)$. Thus, the time for performing a range query about the segments in both regions is proportional to $Nlog_2(N/2)$, which is better than $Nlog_2(N)$.

Similarly, if the IC layout is divided into R regions with each region containing roughly N/R segments, the time for performing a range query about all the segments in all the regions is proportional to $Nlog_2(N/R)$. Equation (1) below explains this mathematically.

$$\text{Total run time} \propto \sum_R \frac{N}{R} \log_2 \frac{N}{R} = N \log_2 \frac{N}{R} \ll N \log_2 N \quad (1)$$

Hence, dividing the IC layout into smaller regions, and creating relatively smaller ng trees to store the data in each region, reduce the total query time. This reduction can be significant if the number of data regions R is on the same order as the number of segments N. In fact, the total query time can be made to increase only linearly with the number of segments, by increasing the number of data regions R linearly with the number of segments N. For example, if the number of regions R is selected so that it is always equal to N/1000, then the total query time will always be proportional $Nlog_2(1000)$.

The data structure 900 also works well with computers that have smaller system memories. This data structure does not need as much system memory because (1) an EDA application will only need to examine one tile's ng tree for each critical segment, and (2) each tile's ng tree is much smaller than a traditional ng tree that stores the data for all the segments in the IC layout.

While the invention has been described with reference to numerous specific details, one of ordinary skill in the art will recognize that the invention can be embodied in other specific forms without departing from the spirit of the invention. For instance, even though the embodiments described above have only one ng tree for each tile, some embodiments of the invention have more than one ng tree for each tile. For each tile, some embodiments have one ng tree for white segments (i.e., critical segments) and one k-d tree for gray segments (i.e., non-critical segments).

What is claimed is:

1. A method of storing data relating to a plurality of geometric objects that represent interconnect lines in a multidimensional design layout of an integrated circuit, the method comprising:
   defining a plurality of regions in the multidimensional layout, wherein at least a portion of said geometric objects in said multidimensional design layout represent diagonal interconnect lines, and wherein a diagonal interconnect line defines a line deposed in a direction other than zero or ninety degrees relative to the integrated circuit boundaries, and
   creating a plurality of hierarchical data structures for a number of said regions, wherein each hierarchical data structure corresponds to a particular region and stores the data of the geometric objects within its particular region.

2. The method of claim 1, wherein the step of storing the data of the geometric objects within its particular region comprising the steps of:
   generating segment data for each of said "n" sided geometric objects, said segment data specifying "n" number of sides and including "n" vertices for a corresponding geometric object;
   generating a hierarchical tree, with k levels of nodes, to represent said "n" sided geometric objects, wherein each node is associated with one of said segment data, by:
      selecting a discriminating node as a parent node for a corresponding level;
      computing a discriminator dimension;
      selecting one of said "n" vertices based on said discriminator dimension for said discriminating node for use as a discriminator key for each of said k levels; and
      portioning nodes, not yet assigned to said hierarchical tree, into outside_child nodes and inside_child nodes based on a comparison between said discriminator key and segment data for a node under analysis and recursively portioning nodes into said outside_child nodes and said inside_child nodes for each of said k levels.

3. The method of claim 1, further comprising:
   for each particular region that has a hierarchical data structure,
      identifying geometric objects outside of that region that are needed for analyzing the geometric objects within the particular region; and
      inserting data relating to the identified geometric objects into the hierarchical data structure for the particular region.

4. The method of claim 1, wherein a first geometric object crosses a region boundary between first and second regions, the method further comprising:

identifying a first portion of the first geometric object that is within the first region; and inserting data relating to the first portion in the hierarchical data structure of the first region.

5. The method of claim 1 further comprising creating a non-hierarchical data structure to define the plurality of regions.

6. The method of claim 1, wherein creating the non-hierarchical data structure includes creating an array of data objects, wherein each particular data object represents one particular region.

7. The method of claim 6, further comprising linking the data object for each region to that region's hierarchical data structure.

8. The method of claim 1, further comprising adaptively determining the number of the regions based on the number of the geometric objects.

9. The method of claim 8, wherein the number of regions increases linearly with the number of geometric objects.

10. The method of claim 1, further comprising adaptively determining the number of the regions based on the dimensions of the interconnect lines.

11. The method of claim 1, wherein the hierarchical data structures comprise ng trees.

12. The method of claim 1, further comprising performing a range query on one of the hierarchical data structures to identify geometric objects that are within a halo distance of a particular geometric object.

13. A computer readable medium comprising a plurality of instructions for manipulating data relating to a plurality of geometric objects that represent interconnect lines in a multidimensional design layout of an integrated circuit, said instructions, when executed by a computer, cause the computer to perform the steps of:

defining a plurality of regions in the multidimensional layout, wherein at least a portion of said geometric objects in said multidimensional design layout represent diagonal interconnect lines, and wherein a diagonal interconnect line defines a line deposed in a direction other than zero or ninety degrees relative to the integrated circuit boundaries, and creating a plurality of hierarchical data structures for a number of said regions, wherein each hierarchical data structure corresponds to a particular region and stores the data of the geometric objects within its particular region.

14. The computer readable medium of claim 13, wherein the step of storing the data of the geometric objects within its particular region comprising the steps of:

generating segment data for each of said "n" sided geometric objects, said segment data specifying "n" number of sides and including "n" vertices for a corresponding geometric object;

generating a hierarchical tree, with k levels of nodes, to represent said "n" sided geometric objects, wherein each node is associated with one of said segment data, by:

selecting a discriminating node as a parent node for a corresponding level;

computing a discriminator dimension;

selecting one of said "n" vertices based on said discriminator dimension for said discriminating node for use as a discriminator key for each of said k levels; and portioning nodes, not yet assigned to said hierarchical tree, into outside_child nodes and inside_child nodes based on a comparison between said discriminator key and segment data for a node under analysis and recursively portioning nodes into said outside_child nodes and said inside_child nodes for each of said k levels.

15. The computer readable medium of claim 13, further comprising:

for each particular region that has a hierarchical data structure, identifying geometric objects outside of that region that are needed for analyzing the geometric objects within the particular region; and inserting data relating to the identified geometric objects into the hierarchical data structure for the particular region.

16. The computer readable medium of claim 13, wherein a first geometric object crosses a region boundary between first and second regions, the method further comprising:

identifying a first portion of the first geometric object that is within the first region; and inserting data relating to the first portion in the hierarchical data structure of the first region.

17. The computer readable medium of claim 13 further comprising creating a non-hierarchical data structure to define the plurality of regions.

18. The computer readable medium of claim 13, wherein creating the non-hierarchical data structure includes creating an array of data objects, wherein each particular data object represents one particular region.

19. The computer readable medium of claim 18, further comprising linking the data object for each region to that region's hierarchical data structure.

20. The computer readable medium of claim 13, further comprising adaptively determining the number of the regions based on the number of the geometric objects.

21. The computer readable medium of claim 20, wherein the number of regions increases linearly with the number of geometric objects.

22. The computer readable medium of claim 13, further comprising adaptively determining the number of the regions based on the dimensions of the interconnect lines.

23. The computer readable medium of claim 13, wherein the hierarchical data structures comprise n-g trees.

24. The computer readable medium of claim 13, further comprising performing a range query on one of the hierarchical data structures to identify geometric objects that are within a halo distance of a particular geometric object.

* * * * *